United States Patent [19]
Henrion et al.

[11] Patent Number: 5,583,501
[45] Date of Patent: Dec. 10, 1996

[54] DIGITAL-TO-ANALOG CONVERTER WITH DIGITAL LINEARITY CORRECTION

[75] Inventors: W. S. Henrion; Donald A. Kerth, both of Austin, Tex.

[73] Assignee: Crystal Semiconductor Corporation, Austin, Tex.

[21] Appl. No.: 296,222

[22] Filed: Aug. 24, 1994

[51] Int. Cl.$^6$ .................................................. H03M 1/06
[52] U.S. Cl. ........................ 341/118; 341/120; 341/143
[58] Field of Search .................................... 341/118, 120, 341/143

[56] References Cited

U.S. PATENT DOCUMENTS

| | | | |
|---|---|---|---|
| 3,862,380 | 1/1975 | Hekimian et al. | 179/175.3 R |
| 4,222,107 | 9/1980 | Mrozowski et al. | 364/571 |
| 4,225,963 | 9/1980 | Ferrieu | 375/28 |
| 4,272,760 | 6/1981 | Prazak et al. | 340/347 |
| 4,340,882 | 7/1982 | Maio et al. | 341/118 |
| 4,381,495 | 4/1983 | Hotta et al. | 340/347 DA |
| 4,539,683 | 9/1985 | Hahn et al. | 371/15 |
| 4,612,533 | 9/1986 | Evans | 340/347 |
| 4,709,225 | 11/1987 | Welland et al. | 340/347 |
| 4,746,902 | 5/1988 | Tol et al. | 340/347 |
| 4,775,851 | 10/1988 | Borth | 341/155 |
| 4,835,535 | 5/1989 | Shibayama et al. | 341/120 |
| 4,852,035 | 7/1989 | Michener | 364/724.10 |
| 4,893,264 | 1/1990 | Noll et al. | 364/724.1 |
| 4,943,807 | 7/1990 | Early et al. | 341/120 |
| 4,972,360 | 11/1990 | Cukier et al. | 364/724.04 |
| 4,977,403 | 12/1990 | Larson | 341/143 |
| 4,997,403 | 12/1990 | Larson | 341/143 |
| 4,999,627 | 3/1991 | Agazzi | 341/131 |
| 5,039,989 | 8/1991 | Welland et al. | 341/143 |
| 5,087,914 | 2/1992 | Sooch et al. | 341/120 |
| 5,134,402 | 7/1992 | Miyoshi | 341/144 |
| 5,153,593 | 10/1992 | Walden et al. | 341/143 |
| 5,248,970 | 9/1993 | Sooch et al. | 341/120 |
| 5,257,026 | 10/1993 | Thompson et al. | 341/118 |

OTHER PUBLICATIONS

Lu et al., "A High Quality Analog Oscillator Using Oversampling D/A Conversion Techniques," IEEE, New York, N.Y., IEEE Transactions on Circuits and Systems—II: Analog and Digital Signal Processing, vol. 41, No. 7, Jul. 1994.

Lu et al., "An Analog Multi–Tone Signal Generator for Built–In–Self–Test Applications," IEEE, New York, N.Y., International Test Conference, Washington, D.C., Oct. 2–6, 1994, pp. 650–659.

(List continued on next page.)

*Primary Examiner*—Marc S. Hoff
*Attorney, Agent, or Firm*—Arnold, White & Durkee

[57] ABSTRACT

Digital linearity correction is obtained by generating a digital calibration signal having at least one frequency component, converting the digital calibration signal to an analog signal, and detecting distortion in the analog signal generated from the calibration signal by nonlinearity to produce a compensation coefficient used to digitally compensate the digital input of the digital-to-analog converter. The compensation coefficient is adjusted in a feedback loop so that the distortion is minimized. Preferably the calibration signal has two frequencies, and the distortion is an intermodulation component having a substantially lower frequency. The intermodulation component, for example, is selected by an R-C low-pass filter, digitized by an analog-to-digital converter, and detected by digital signal processing. The analog-to-digital converter may have low resolution, low dynamic range and a low sampling rate. Preferably the digital compensation includes computing a third-order polynomial, and the intermodulation components for the second and third order terms are detected at about the same frequency. Preferably the offset of the digital-to-analog converter is calibrated first by setting the digital input to zero, modulating the analog output at about the same frequency, and adjusting the offset to eliminate any signal from the modulator. The calibration method can also be used to compensate for nonlinearity in signal conditioning circuitry, or to obtain a specified non-linear transfer characteristic.

59 Claims, 17 Drawing Sheets

OTHER PUBLICATIONS

Toner et al., "A BIST Scheme for an SNR Test of a Sigma–Delta ADC," IEEE, New York, N.Y., International Test Conference, Baltimore, Maryland, Oct. 17–21, 1993, pp. 805–814.

Toner et al., "Towards Built–In–Self–Test for SNR Testing of a Mixed–Signal IC," IEEE, New York, N.Y., International Symposium on Circuits and Systems, Chicago, IL, May 3–6, 1993, pp. 1599–1602.

Toner et al., "Histogram–Based Distortion and Gain Tracking Testing of an 8–bit PCM Mixed Analog–Digital IC Chip," IEEE, New York, N.Y., Proceedings of the 32nd Midwest Symposium on Circuits and Systems, Washington, D.C., pp. 760–763, Aug. 1992.

Lu, et al., "High–Quality Analog Oscillator Using Oversampling D/A Conversion Techniques", Jul. 19, 1993.

Cataltepe et al., "Digitally Corrected Multi–Bit $\Sigma\Delta$ Data Converters", 1989 IEEE International Symposium on Circuits and Systems, Portland Hilton, Portland, OR, May 8–11, 1989, pp. 647–650.

Matsuya, et al., "A 17–bit Oversampling D–to–A Conversion Technology Using Multistage Noise Shaping", 1989 IEEE Journal of Solid–State Circuits, vol. 24, No. 4, Aug. 1989, pp. 969–975.

"Self–Calibrating High Resolution True 16–Bit Digital––To–Analog Converter", Jun. 1981, Burr–Brown Research Corporation, Tucson, Arizona.

Prazak et al., "Correcting errors digitally in data acquisition control", Electronics, Nov. 22, 1979, pp. 123–128.

Maio, et al., "An Untrimmed D/A Converter with 14–Bit Resolution", IEEE Journal of Solid–State Circuits, vol. SC–16, No. 6, Dec. 1981, pp. 616–620.

Ferguson, et al., "An 18b 20KHz Dual $\Sigma\Delta$ A/D Converter", 1991 IEEE International Solid–State Circuits Conference, Feb. 14, 1991, pp. 68–69, 292.

Kerth et al., "A 120dB Linear Switched–Capacitor Delta––Sigma Modulator", 1994 IEEE International Solid State Circuits Conference, Feb. 17, 1994, pp. 196–197.

Lee et al., "Self–Calibration Technique for A/D Converters", IEEE Transactions on Circuits and Systems, vol. CAS–30, No. 3, Mar. 1983, pp. 188–190.

Lee, et al., "Self–Calibrating 15 Bit CMOS A/D Converter", IEEE Journal of Solid State Circuits, vol. SC–19, No. 6, Dec. 1984, pp. 813–819.

L. Richard Carley, "A Noise–Shaping Coder Technology for 15+ Bit Converters", IEEE Journal of Solid–State Circuits, vol. 24, No. 2, Apr. 1989, 267–273.

Yang, et al., "On–Line Adaptive Digital Correction of Dual–Quantisation Delta–Sigma Modulators", Electronics Letters 30 Jul. 1992 vol. 28, No. 16, pp. 1511–1513.

Abdennadher, et al., "Adaptive Selfcalibrating Delta–Sigma Modulators", Electronic Letters, 2nd Jul. 1992, vol. 28, No. 14, pp. 1288–1289.

van den Enden et al., "Discrete–time signal processing—An introduction", Prentice Hall International (UK) Ltd., New York, N.Y 1989, pp. 108–109, 272–273.

Fig. 11A
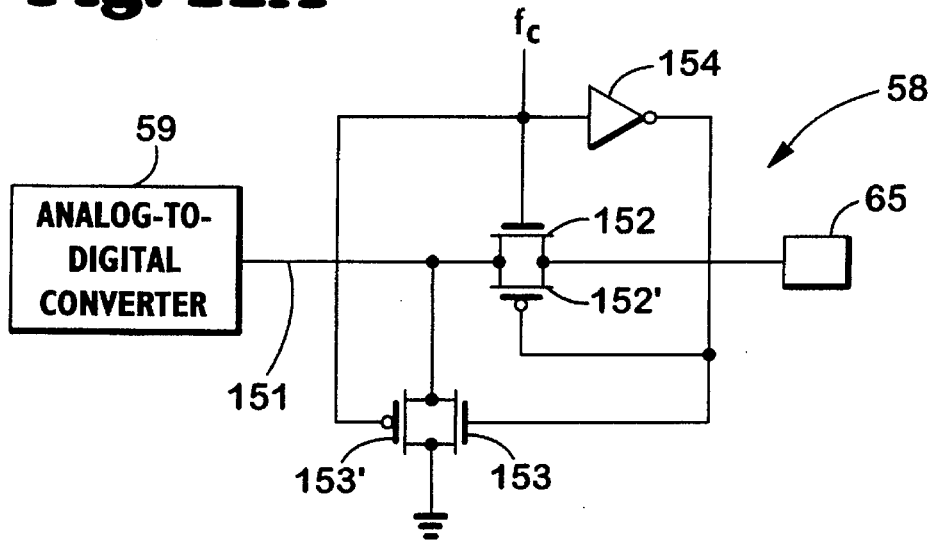
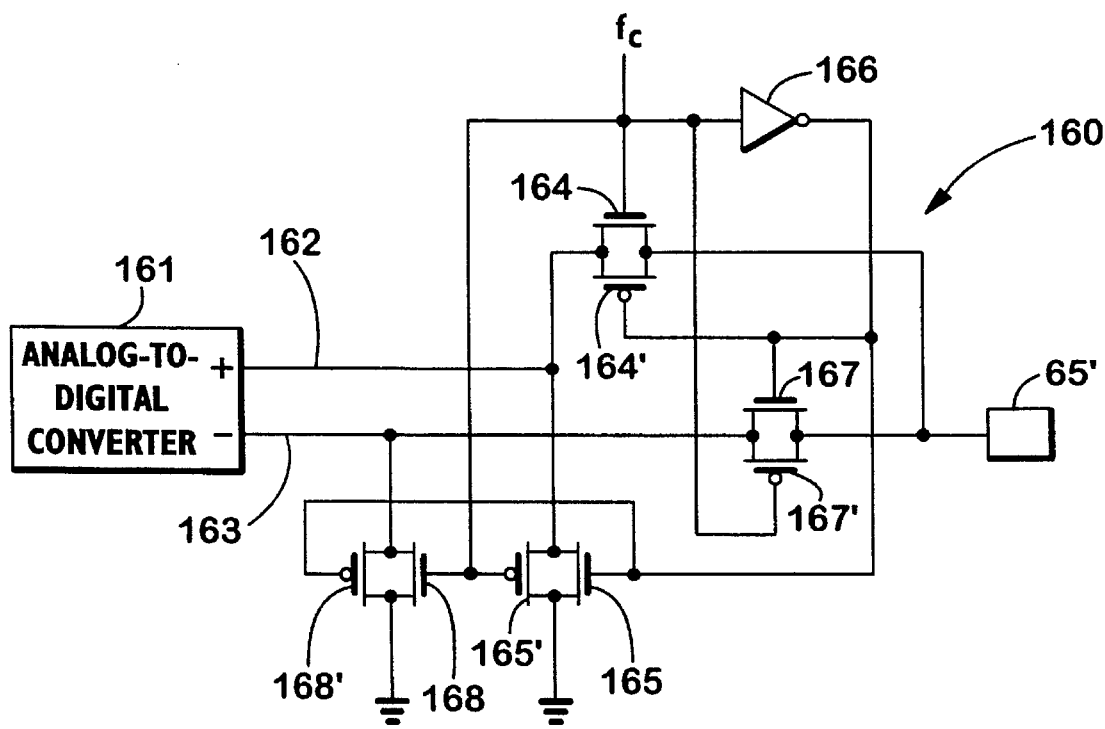
Fig. 11B

DIGITAL-TO-ANALOG CONVERTER WITH DIGITAL LINEARITY CORRECTION

BACKGROUND OF THE INVENTION

1. Field of the Invention

The present invention relates generally to digital-to-analog converters, and more particularly to a method and apparatus for correcting nonlinearity in the digital-to-analog conversion process and/or in signal conditioning following the digital-to-analog conversion process. Specifically, the present invention relates to a method for correcting nonlinearity that does not require a linearity reference and is not limited to a particular kind of converter technology.

2. Description of the Background Art

High resolution digital-to-analog conversion (DAC) technology has become one of the key analog circuit technologies for digital audio and telecommunications applications. Precision of at least sixteen bits is readily achieved in monolithic form using oversampling converters, such as the delta-sigma digital-to-analog converter described in Sooch et al., U.S. Pat. No. 5,087,914. In such a delta-sigma converter, an interpolation filter receives a digital input signal at the input sampling rate $F_s$, increases the sampling rate, and then filters all images and quantization noise at $F_s/2$ and above. The output of the interpolation filter is received by a digital delta-sigma modulator that converts the output of the interpolation filter to a one-bit data stream. This one-bit data stream controls a one-bit DAC having only two analog levels. The analog signal from the DAC is received by an analog low-pass filter that provides the analog output of the delta-sigma digital-to-analog converter. Because the analog output is derived from the two analog levels of the one-bit DAC, the digital-to-analog conversion process is monotonic and highly linear.

Delta-sigma digital-to-analog converters are capable of providing precision greatly in excess of sixteen bits. At the higher resolution, however, non-linearity becomes significant with respect to the least significant bit of resolution. For instrumentation applications, the non-linearity represents an error or deviation from an accurate value. In audio or signal processing applications, the non-linearity causes harmonic and intermodulation distortion to appear in the converted signal. Such harmonic and intermodulation distortion may mask desired components of the converted signal.

Most known techniques for achieving high linearity in digital-to-analog conversion require some kind of highly linear calibration reference. A ramp function generator has been used as a linearity reference for calibrating a D/A converter. As described in Maio et al,. "An Untrimmed D/A Converter with 14-Bit Resolution," an R/2R ladder DAC has a duplicate set of switched current sinks providing a sub-DAC responsive to compensation data. The compensation data are read from a RAM that is programmed during a calibration cycle. In the calibration cycle, a counter circuit provides the digital input to the DAC, and the output of the DAC is compared to a highly linear ramp function generated by a Miller integrator using a styrol capacitor. The counter circuit is responsive to the comparison in order to program the RAM with the calibration data.

A low distortion sine wave oscillator has been used as a linearity reference for calibrating a DAC in a subranging analog-to-digital converter (ADC). As described in Evans, U.S. Pat. No. 4,612,533, digital calibration values for reducing harmonic distortion are computed by a microprocessor that performs a fast Fourier transform on digitized values when the low distortion sine wave oscillator is input to the analog-to-digital converter.

An analog-to-digital converter has been used as a linearity reference for calibrating a digital-to-analog converter. As described in Cataltepe et al., "Digitally Corrected Multi-Bit $\Sigma\Delta$ Data Converters," 1989 IEEE International Symposium on Circuits and Systems, Portland, Oregon, May 8–11, 1989, the circuit blocks of a multi-bit delta-sigma ADC are rearranged during calibration to form a single-bit delta-sigma ADC that is used to calibrate a multi-bit internal subconverter DAC. During calibration, the input signal to the single-bit delta-sigma ADC is a digital ramp generated by an N-bit counter and fed to the input of the multi-bit internal subconverter DAC. The output of the subconverter DAC is digitized by the single-bit delta-sigma ADC. The single-bit delta-sigma ADC provides non-linearity data that are stored in a memory.

The above methods employing a linearity reference suffer the problem that the precision of the calibrated DAC is limited by the precision of the linearity reference, and it is relatively difficult to obtain a good linearity reference.

A self-calibration technique has been devised for calibrating a switched-capacitor DAC that is internal to a successive-approximation ADC. As described in Welland et al., U.S. Pat. No. 4,709,225, it is desirable in such a DAC for the capacitors to form a binarily weighted sequence of values. The self-calibration technique includes sequentially connecting trim capacitors in parallel with a primary capacitor and determining as each trim capacitor is connected, whether the resultant parallel capacitance is larger or smaller than that of a reference capacitor. If the resultant capacitance is too large, the trim capacitor is disconnected, but otherwise it is left connected. The process is repeated, until each trim capacitor has been tried. The final resultant capacitance is the capacitance of the smallest capacitance value in the sequence. For adjusting the next-largest capacitance value in the sequence, the final resultant capacitance is connected in parallel with the reference capacitor to form a new reference capacitor, and the process is repeated to trim the next-largest capacitance value in the sequence, and so on, until all of the capacitance values have been trimmed.

Known self-calibration methods are limited to a particular kind of converter technology. Accordingly, there is a need for a method of correcting nonlinearity in a digital-to-analog converter that does not require a linearity reference and is not limited to a particular kind of converter technology.

SUMMARY OF THE INVENTION

In accordance with a basic aspect of the present invention, there is provided a method of operating a digital-to-analog converter. The method includes the steps of: generating a digital calibration signal having at least one frequency component; operating the digital-to-analog converter in a calibration mode to convert the digital calibration signal to produce an analog signal; detecting, in the analog signal, a frequency component generated from the digital calibration signal by nonlinearity, to produce a compensation coefficient; and operating the digital-to-analog converter in a conversion mode in which a digital input signal is digitally compensated by the compensation coefficient to produce a distorted digital signal, the compensation coefficient specifying a degree of nonlinear distortion of the digital input signal produced in the distorted digital signal; and in which the distorted digital signal is converted by the digital-to-analog converter to produce an analog signal having reduced nonlinear distortion. This method has the advantage that a linearity reference is not needed, because the calibration signal having at least one frequency component can be precisely generated using digital techniques. This method also has the advantage that it is not limited to a particular kind of converter technology.

In accordance with another aspect, the present invention provides a method of calibrating a digital-to-analog converter. This method includes the steps of: generating a digital calibration signal having at least one frequency component; compensating the digital calibration signal in accordance with at least one compensation coefficient to produce a distorted version of the digital calibration signal, the compensation coefficient specifying a degree of nonlinear distortion of the digital calibration signal produced in the distorted version of the digital calibration signal; operating the digital-to-analog converter to convert the distorted version of the digital calibration signal to produce an analog signal; detecting, in the analog signal, a frequency component absent from the digital calibration signal; and adjusting the compensation coefficient in response to the detected frequency component absent from the digital calibration signal so that the detected frequency component is reduced and the analog signal has reduced nonlinear distortion. This method has the further advantage that the detected frequency component can be reduced to substantially zero by continued or repeated adjustment of the compensation coefficient.

In accordance with yet another aspect, the present invention provides a method of operating a digital-to-analog converter including the steps of: generating a digital calibration signal having a first frequency component and a second frequency component; operating the digital-to-analog converter in a calibration mode to convert the digital calibration signal to produce an analog signal; low-pass filtering the analog signal to produce a filtered analog signal; detecting, in the filtered analog signal, an intermodulation component, to produce a compensation coefficient, the intermodulation component being at a frequency that is a difference between the first frequency and the second frequency, the intermodulation component being generated from the digital calibration signal by nonlinearity, and the first frequency component and the second frequency component having been reduced in amplitude relative to the intermodulation component by the low-pass filtering; and operating the digital-to-analog converter in a conversion mode in which a digital input signal is digitally compensated by the compensation coefficient to produce a distorted digital signal, and in which the distorted digital signal is converted by the digital-to-analog converter to produce an analog signal having reduced distortion. This method has the advantage that the step of detecting the intermodulation component in the filtered signal can be performed with circuitry that is somewhat nonlinear, because the first frequency component and the second frequency component are reduced in amplitude relative to the intermodulation component by the low-pass filtering, and therefore nonlinearity in the detector is less able to cause an interfering intermodulation signal. Preferably the intermodulation component in the filtered signal is detected by digitizing the filtered signal in an analog-to-digital converter to produce a digital signal, and digitally processing the digitized signal to detect the intermodulation component. In this case, the analog-to-digital converter may have a substantially lower dynamic range, resolution, and sampling rate than the digital-to-analog converter. The digitized signal is processed digitally by passing the digitized signal through a digital band-pass filter and detecting the amplitude of the output of the filter. Alternatively, the intermodulation component is synchronously detected in the digitized signal.

In accordance with still another aspect, the present invention provides a method of operating a digital-to-analog converter including the steps of: generating a first digital calibration signal having two frequency components; operating the digital-to-analog converter in a calibration mode to convert the first digital calibration signal to produce a first analog signal; detecting, in the first analog signal, a first intermodulation component generated from the two frequency components in the first digital calibration signal, to produce a first compensation coefficient; generating a second digital calibration signal having two frequency components; operating the digital to-analog converter in a calibration mode to convert the second digital calibration signal to produce a second analog signal; detecting, in the second analog signal, a second intermodulation component generated from the two frequency components in the second digital calibration signal, to produce a second compensation coefficient; and operating the digital-to-analog converter in a conversion mode in which a digital input signal is digitally compensated by the compensation coefficients to produce a distorted digital signal, and in which the distorted digital signal is converted by the digital-to-analog converter to produce an analog signal having reduced distortion. This method has the further advantage that the first intermodulation component and the second intermodulation component can have substantially the same frequency, so that the same circuitry can be used for detecting each of the intermodulation components.

In accordance with yet another aspect of the invention, there is provided a method of using an analog-to-digital converter for calibrating a digital-to-analog converter to reduce offset of the digital-to-analog converter. The method includes the steps of: operating the digital-to-analog converter to convert a digital input value of substantially zero to an analog signal; chopping the analog signal at a chopping frequency to produce a modulated signal; operating the analog-to-digital converter to digitize the modulated signal to produce a digitized signal; digitally detecting a component at the chopping frequency in the digitized signal; adjusting the digital input value to minimize the detected component at the chopping frequency in the digitized signal and produce a digital offset value; and using the digital offset value to offset a digital signal prior to conversion of the digital signal by the digital-to-analog converter. This method has the advantage that the same circuitry for detecting and eliminating the distortion components can also be used for detecting and eliminating offset.

The calibration methods of the present invention can also be used to compensate for nonlinearity in signal conditioning circuitry, or to obtain a specified non-linear transfer characteristic. To compensate for nonlinearity in signal conditioning circuitry, the signal conditioning circuitry is connected between the digital-to-analog converter and the analog output to pass the analog signal generated by the digital-to-analog converter to the analog output, and the compensation coefficient is adjusted to eliminate any distortion component from the analog output. Therefore, the method compensates for nonlinearity in the transfer function representing the combination of the digital-to-analog converter and the signal conditioning circuitry. To obtain a specified non-linear transfer characteristic, the compensation coefficient is first adjusted to compensate for nonlinearly, and then it is further adjusted to obtain the specified non-linear transfer characteristic.

The present invention also provides a digital-to-analog conversion system especially adapted for using the methods of the invention to compensate for nonlinearity.

BRIEF DESCRIPTION OF THE DRAWINGS

Other objects and advantages of the invention will become apparent upon reading the following detailed description and upon reference to the drawings in which:

FIG. 11A is a schematic diagram of a switching modulator introduced in FIG. 2, and constructed for use with a single-ended input to an analog-to-digital converter;

FIG. 11B is a schematic diagram of an alternative circuit for a switching modulator for use with an analog-to-digital converter having complementary inputs;

Figure 1:
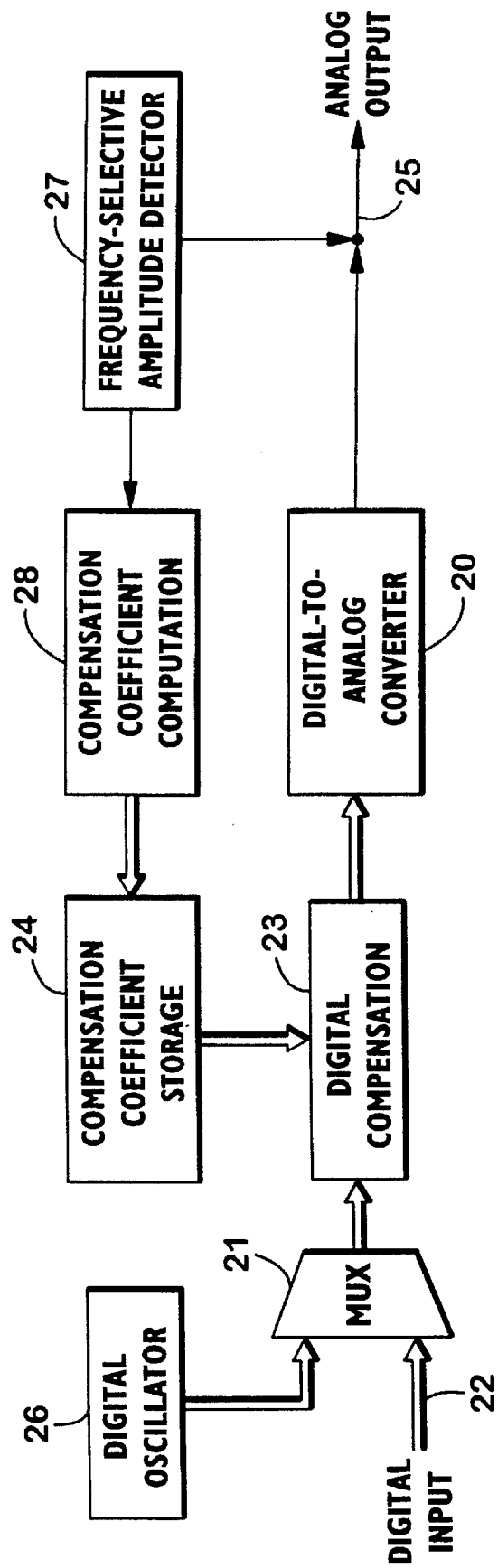
FIG. 1 is a block diagram of a digital-to-analog converter using a digital compensation technique in accordance with the invention for correcting nonlinearity.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the scope of the invention as defined by the appended claims.

DESCRIPTION OF THE PREFERRED EMBODIMENTS

Turning now to the drawings, there is shown in FIG. 1 a block diagram of a digital-to-analog converter 20 and associated components for digitally compensating nonlinearity in the converter. During a normal mode of operation, a digital multiplexer 21 selects a digital input 22 and applies the digital input to digital compensation 23. The digital compensation 23 modifies the digital input 22 in accordance with compensation coefficients read from storage 24. The compensated digital input is converted by the digital-to-analog converter 20 to provide an analog output 25.

The digital compensation 23 could be performed in a variety of ways, such as by addressing the storage 24 with the digital value to look-up a corresponding compensated value. Alternatively, the digital compensation could be performed by interpolation between values looked up in a table addressed by a most significant bit portion of the digital input. As further described below with reference to FIGS. 2 and 4, however, the preferred method of digital compensation is computation of a polynomial function of the digital input using polynomial coefficients read from the compensation coefficient storage 24.

The present invention more particularly concerns a method for determining the values of the compensation coefficients in order to correct for nonlinearity in the digital-to-analog converter 20. These compensation coefficients are determined by operating the digital-to-analog converter 20 in a calibration mode. During the calibration mode, the multiplexer 21 selects the digital oscillator 26, and applies the digital values from the oscillator to the digital compensation 23. The multiplexer 21, for example, could be an adder or addition step in which the digital input 22 is forced to zero during calibration. Consequently, the digital-to-analog converter 20 responds to the digital oscillator 26 to generate an analog output 25 including at least one frequency component.

Nonlinearity in the digital-to-analog converter 20 causes frequency components other than those generated by the digital oscillator 26 to appear in the analog output 25. The nonlinearity is removed by adjusting the compensation coefficients so that only the frequency components generated by the digital oscillator 26 appear in the analog output 25. For this purpose, a frequency-selective amplitude detector 27 is tuned to a harmonic component of at least one frequency component from the digital oscillator 26, or is tuned to an intermodulation component of more than one frequency component from the digital oscillator 26. Based on the distortion component detected by the detector 27, compensation coefficient computation 28 computes a value for at least one of the compensation coefficients in the storage 24 in such a way as to reduce or eliminate the distortion component detected by the detector 27. This process can be repeated until the distortion component is reduced below a predetermined level or for a fixed number of iterations. This process can be repeated for additional distortion components obtained by changing the frequency or frequencies generated by the digital oscillator 26 or selected by the detector 27.

The nonlinearity compensation method of FIG. 1 has the advantage that it does not require a linearity reference, because the digital oscillator 26 inherently generates very pure frequency components, and the frequency-selective amplitude detector 27 is easily constructed so that it does not introduce significant nonlinearity in the feedback loop. Therefore, the digital compensation method illustrated in FIG. 1 can be used to correct for integral nonlinearity in any kind of digital-to-analog converter without requiring a linearity reference.

The nonlinearity compensation method of FIG. 1 has the additional advantage that the compensation coefficients are determined in a feedback loop (including blocks 20, 23, 24, 27 and 28) that is relatively insensitive to the magnitude of the loop gain. Moreover, the frequency-selective amplitude detector 27 may indicate the average value, the RMS value, energy, or any other characteristic or measure indicative of or responsive to the amplitude of the signal passing within the pass-band of the frequency-selective amplitude detector 27. The feedback loop assures that the distortion component is reduced to zero when any of these characteristics or measures is reduced to zero.

The nonlinearity compensation method of FIG. 1 also has the advantage that it is not necessary to measure the DC level of the analog output 25, so that the method is relatively immune from 1/f noise. Instead, the nonlinearity compensation method of FIG. 1 is responsive to the amplitudes of distortion components at sufficiently high frequencies that the nonlinearity correction is not limited by 1/f noise.

It is also possible to use the system shown in FIG. 1 for obtaining a specified nonlinear digital-to-analog transfer function from the digital input 22 to the analog output 25. In this case, the nonlinearity of the digital-to-analog converter 20 is first compensated as described above. Then the compensation coefficients in the storage 24 are adjusted by a certain amount to obtain the specified nonlinear digital-to-analog transfer function. For example, if the compensation coefficients specify a polynomial, as further described below with reference to FIG. 2, then the coefficients are adjusted by adding polynomial terms representing the desired nonlinearity. A specified nonlinear digital-to-analog transfer function, for example, can be used for decompression of previously compressed signals or for the compression of digital signals to obtain compressed analog signals.

Figure 2:
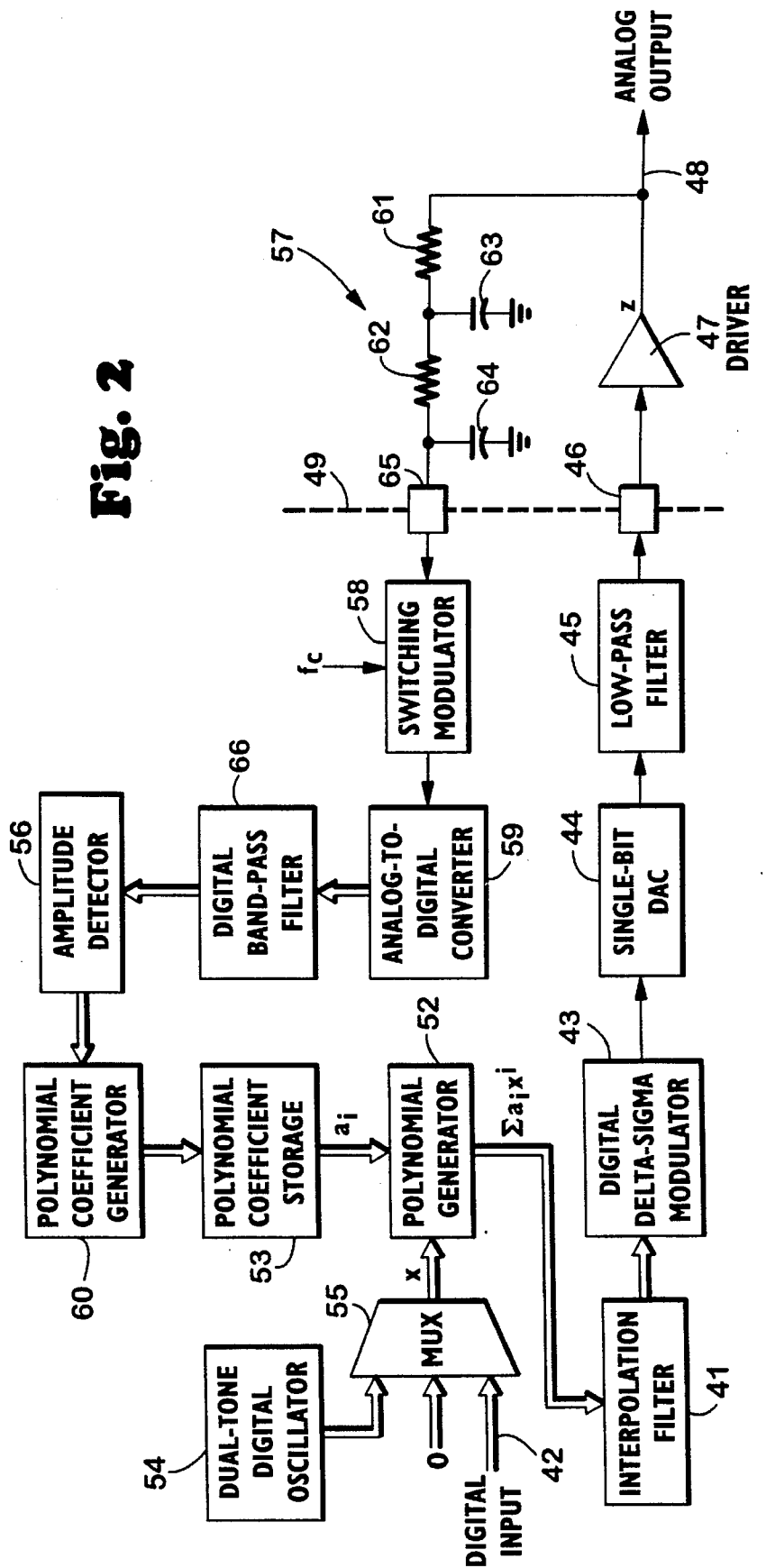
FIG. 2 is a specific embodiment of a digital-to-analog converter using the digital compensation technique introduced in FIG. 1.

Turning now to FIG. 2, there is shown a block diagram of a preferred embodiment of a digital-to-analog converter including circuitry for compensating nonlinearity. In this example, the digital-to-analog converter is a delta-sigma digital-to-analog converter. Such a delta-sigma digital-to-analog converter may include an interpolation filter 41 for receiving a digital input 42 at a certain sampling rate and increasing the sampling rate by a predetermined factor such as a factor of 128. The output of the interpolation filter 41 is provided to a digital delta-sigma modulator 43 which converts the digital signal to a 1-bit digital stream. The 1-bit digital stream is provided to a single-bit digital-to-analog converter (DAC) 44 which converts the digital stream to an analog signal having either one of two voltage levels. This analog signal is filtered by a low-pass filter 45 to produce an analog signal having a more smoothly varying amplitude so that the digital input 42 is represented by an analog signal having frequency components limited to no more than about one-half the original sampling rate of the digital input 42. Further details regarding the construction and operation of a delta-sigma digital-to-analog converter are disclosed in Sooch et al., U.S. Pat. No. 5,087,914, incorporated herein by reference.

The output of the low-pass filter 45 appears on a terminal 46 and may be buffered by a driver 47 to provide a low-impedance analog output 48. In practice, it is desirable to fabricate the interpolation filter 41, the digital delta-sigma modulator 43, the single-bit digital-to-analog converter 44, and the low-pass filter 45 in a common semiconductor integrated circuit along with other components shown in FIG. 2 to the left of an integrated-circuit boundary 49 shown as a dashed line. The driver 47, however, is external to the integrated circuit, so as to supply any desired level of power, or other signal conditioning, to the analog output 48. This also permits the semiconductor integrated circuit to be used in a variety of different applications in which the customer of the integrated circuit furnishes an external signal conditioning circuit such as the driver 47 for a specific application. If a high level of power is not needed, then the driver 47 could be omitted so that the terminal 46 would provide the analog output 48.

In order to compensate for nonlinearity in the combination of the single-bit DAC 44, the low-pass filter 45, and the driver 47, the digital input signal from the digital input 42 is predistorted by a polynomial generator 52 which generates a polynomial $\Sigma a_i x^i$ of the interpolated digital signal (x) and a set of polynomial coefficients ($a_i$) from the polynomial coefficient storage 53.

In order to determine a set of polynomial coefficients so that the analog output 48 is a linear function of the digital input 42, the circuit in FIG. 2 includes a dual-tone digital oscillator 54, and a digital multiplexer 55 that either selects the digital input 42 during a normal mode of operation, or selects the output of the dual-tone digital oscillator 54 during a calibration mode, or selects a value of zero during the calibration mode, and provides the selected signal (x) to the polynomial generator 52. (Of course, a value of zero could be selected in any number of alternative and equivalent ways, such as always operating the multiplexer in the calibration mode to select the output of the dual-tone oscillator 54, and forcing the output of the oscillator to zero by loading zeros into the oscillator.)

For the construction shown in FIG. 2, the digital input 42 and the dual-tone digital oscillator 54 would supply digital samples at the same rate to their respective inputs of the multiplexer 55. This would permit the dual-tone digital oscillator 54 to operate at a relatively low rate. The dual-tone oscillator 54 could be operated at a higher sampling rate than the sampling rate of the digital input 42, however, if an additional interpolation filter (not shown) were inserted between the digital input 42 and the multiplexer 55. Operation of the dual-tone digital oscillator 54 at the higher rate would reduce noise in the oscillator signal. For example, the additional interpolating filter (not shown) could increase the sampling rate of the digital input 42 from 2000 samples per second to 16,000 samples per second, and in this example the dual-tone digital oscillator 54 would be operated at a sampling rate of 16,000 samples per second, and the interpolation filter 41 could increase the rate of 16,000 samples per second to a rate of 128,000 samples per second.

For determining a constant polynomial coefficient ($a_0$), the multiplexer 55 selects a value of zero, and supplies the value of zero to the polynomial generator 52. As further described below, the constant coefficient ($a_0$) is generated such that the analog output 48 has a value of substantially zero when the polynomial generator 52 has an input value (x) of zero. In this fashion, dc offset is removed from the digital-to-analog conversion process (from the input value (x) to the analog output 48) before the determination of the quadratic ($a_2$), the cubic ($a_3$), and any higher-order polynomial coefficients.

For determining the quadratic ($a_2$), the cubic ($a_3$), and any higher-order polynomial coefficients, the dual-tone digital oscillator generates a calibration signal including a pair of frequencies. This calibration signal is selected by the multiplexer 55 and passes through the polynomial generator 52, the interpolation filter 41, the digital delta-sigma modulator 43, the single-bit DAC 44, the low-pass filter 45, and the driver 47. Let z(x) denote the transfer function of this signal path from the input (x) of the polynomial generator 52 to the analog output 48. Nonlinearity in this transfer function z(x) generates harmonics and intermodulation components between the two frequencies of the calibration signal from the oscillator 54, and these harmonics and intermodulation components appear at the analog output 48.

The transfer function Z(x) can be expressed as a power series of the input (x) according to:

$$Z(x) = \alpha_0 + \alpha_1 x + \alpha_2 x^2 + \alpha_3 x^3 + \ldots$$

The second order term $\alpha_2 x^2$ can generate second harmonics and intermodulation products between two sinusoids $\cos(\omega_1 t)$ and $\cos(\Omega_2 t)$ according to:

$$\begin{aligned}\alpha_2(\cos(\omega_1 t) + \cos(\omega_2 t))^2 &= \alpha_2 \cos^2(\omega_1 t) + \\ &\quad \alpha_2 \cos^2(\omega_2 t) + \\ &\quad 2\alpha_2 \cos(\omega_1 t)\cos(\omega_2 t) \\ &= \alpha_2 + 1/2\, \alpha_2 \cos(2\omega_1 t) + \\ &\quad \alpha_2 + 1/2\, \alpha_2 \cos(2\omega_2 t) + \\ &\quad \alpha_2 \cos((\omega_1 - \omega_2)t) + \\ &\quad \alpha_2 \cos((\omega_1 + \omega_2)t)\end{aligned}$$

Therefore, the second-order term generates four new frequencies, including two harmonics at $2\omega_1$ and $2\omega_2$, and two intermodulation components at $\omega_1 - \omega_2$, and $\omega_1 + \omega_2$. In a similar fashion, it can be shown that the third-order term generates six additional frequencies, including two harmonics at $3\omega_1$ and $3\omega_2$, and four intermodulation components at $2\omega_1 - \omega_2$, $\omega_1 - 2\omega_2$, $2\omega_1 + \omega_2$, and $\omega_1 + 2\omega_2$. In this fashion, a new frequency at an integer multiple of an original frequency is referred to as a harmonic, and the other new frequencies are referred to as intermodulation components. Harmonics and intermodulation components will be referred to collectively as distortion components.

For the circuit of FIG. 2, it is assumed that the gain factor $\alpha_1$ is one, and in this case, if $\alpha_2$ and $\alpha_3$ are small in comparison to 1, then the values of $a_2 = -\alpha_2$ and $a_3 = -\alpha_3$ will effectively cancel the nonlinearity. Preferably, however, an amplitude detector 56 and a digital band-pass filter 66 are used in a feedback loop to find the values of $\alpha_2$ and $\alpha_3$ that best cancel the nonlinearity. The feedback loop also includes a continuous-time low-pass filter generally designated 57, a switching modulator 58, an analog-to-digital converter 59, and a polynomial coefficient generator 60.

Preferably the amplitude detector 56 and band-pass filter 66 detect an intermodulation component at a frequency lower than the two original frequencies generated by the dual-tone digital oscillator 54. Preferably the band-pass filter 66 has a fixed passband, and the intermodulation component to be detected has a frequency ($f_d$) which is relatively fixed throughout the process of generating the polynomial coefficients $\alpha_2$ and $\alpha_3$ that effectively cancel the nonlinearity coefficients $\alpha_2$ and $\alpha_3$. The fixed frequency $f_d$ is within the passband of the digital band-pass filter 66. When generating the polynomial coefficient $\alpha_2$, the intermodulation detector detects the difference ($f_d = f_1 - f_2$) of the two frequencies ($f_1$) and ($f_2$) generated by the dual-tone oscillator 54. When generating the polynomial coefficient $\alpha_3$, at least one (and preferably only one) of the two frequencies of the dual-tone digital oscillator is changed so that at this later time the difference between one of the two frequencies of the dual-tone digital oscillator 54 and twice the other of the two frequencies of the dual-tone digital oscillator is approximately the frequency $f_d$. For example, when generating the polynomial coefficient $\alpha_3$, the dual-tone digital oscillator generates frequencies $f_1$ and $f_3$ such that $f_d = f_1 - 2f_3$ and therefore $f_2 = 2f_3$.

Preferably the low-pass filter 57 sufficiently attenuates the two tones from the dual-tone digital oscillator 54, and the distortion components other than the component to be detected, so that any nonlinearity in the feedback path (from the analog output 48 to the amplitude detector 56 and including the low-pass filter 57, switching modulator 58, analog-to-digital converter 59, and digital band-pass filter 66) will only generate distortion components which are negligible compared to the distortion components generated in the forward path (from the input of the polynomial generator 52 to the analog output 48 and including the interpolation filter 41, the polynomial generator 52, the digital delta-sigma modulator 43, the single-bit DAC 44, the low-pass filter 45, and the driver 47).

As shown in FIG. 2, the continuous-time low-pass filter 57 includes series resistors 61, 62 and shunt capacitors 63, 64. Although the low-pass filter 57 is shown having two resistor-capacitor sections, the filter 57 could have a greater or lesser number of sections. The number of sections needed depends on the frequency difference between the intermodulation component to be detected and the lower oscillator frequency generating the intermodulation component, the desired amount of rejection of power line noise, the dynamic range of the analog-to-digital converter 59, and the linearity of the analog-to-digital converter 59. The resistor 61 has a low voltage coefficient; for example, it is a highly linear metal film resistor. The capacitor 63 also has a relatively low voltage coefficient; for example, it is fabricated of polypropylene film, polystyrene film, polyester film, or mica. The linearity of the capacitor 63, however, is not particularly critical because the tones at the analog output 48 from the dual-tone digital oscillator are partially low-pass filtered upon reaching the capacitor 63. Neither the linearity of the resistor 62 nor the linearity of the capacitor 64 is critical because the filtering of the resistor 61 and the capacitor 63 attenuates the undesired signals before the undesired signals reach the resistor 62 and the capacitor 64.

The cut-off frequency of the low-pass filter 57 is preferably at about the frequency $f_d$ of the intermodulation component detected by the amplitude detector 56 and the band-pass filter 66. For example, the frequency $f_d$ is 4 Hz, and the cut-off frequency of the low-pass filter 57 is slightly above 4 Hz, for example at about 6 Hz.

The switching modulator 58 can be used in order to determine the zero-order polynomial coefficient ($a_0$) in such a way that the analog output 48 is at a ground reference when the digital input 42 is zero, as will be further described below. So that this dc offset calibration can be performed independent of any dc offset of the analog-to-digital converter 59, the switching modulator 58 is an analog modulator, as described below with reference to FIGS. 10A and 10B, which provides a modulated signal to the input of the analog-to-digital converter 59.

In an alternative construction that may be used if the analog-to-digital converter 59 has a relatively low dc offset, the switching modulator circuitry can be simplified by interchanging the positions of the switching modulator 58 and the analog-to-digital converter 59 so that the input of the analog-to-digital converter is connected directly to the terminal 65 and the switching modulator modulates the output of the analog-to-digital converter and supplies the modulated signal to the input of the digital band-pass filter 66. In this alternative construction, the switching modulator is simplified because the modulation can be performed digitally by selectively complementing the digital output of the analog-to-digital converter 59 in response to the modulating or chopping signal ($f_c$). For example, the output of the analog-to-digital converter 59 could be received by an adder/subtractor that is controlled by the chopping signal ($f_c$) to either add or subtract the digital output of the analog-to-digital converter 59. This adder/subtractor would be used in lieu of the adder 96 at the input of the digital band-pass filter shown in FIG. 5 and further described below.

In a second alternative construction that may be used if the analog-to-digital converter 59 has a relatively low dc offset, the switching modulator 58 would be eliminated and a digital modulator would not be used. Instead, the coefficients in the band-pass filter 66 would be changed just during the determination of the zero-order coefficient ($a_0$) so that the band-pass filter would become a low-pass filter at this time, and also at this time the amplitude detector 56 would have its polarity selected or forced so as to cancel or reduce the dc offset at the analog output 48. This second alternative construction would operate in a fashion analogous to the cancellation of dc offset at the digital output 217 in the system of FIG. 12A, as will be further described below.

Preferably the analog-to-digital converter 59 is a delta-sigma converter including a delta sigma modulator generating a one-bit data stream, and a digital decimating or band-pass filter responsive to the one-bit data stream rate for producing a multi-bit digital output. Further details regarding the construction of suitable delta-sigma analog-to-digital converters are found in Early et al., U.S. Pat. No. 4,943,807, incorporated herein by reference; and Ferguson et al., "An 18b 20 KHz Dual $\Sigma \Delta$ AD Converter," Proceedings of the 1991 IEEE International Solid-State Circuits Conference, pp. 68–69 and 292, incorporated herein by reference; and Kerth, et al., "A 120 dB Linear Switched-Capacitor $\Delta$-$\Sigma$Modulator," Proceedings of the 1994 IEEE International Solid-State Circuits Conference, pp. 196–197, incorporated herein by reference.

The analog-to-digital converter 59 may have a relatively low speed and relatively low dynamic range, because the frequency and amplitude of the intermodulation component to be detected, the dc component, and residual high frequency components are relatively low. This results from the fact that the magnitudes of the nonlinearity coefficients $\alpha_2$ and $\alpha_3$ are relatively small, and the tones from the dual-tone oscillator and other high frequencies are rejected by the low-pass filter 57. The linearity of the analog-to-digital converter 59 is not critical, because the fundamental frequency components are small at this point. Any distortion of the intermodulation component to be detected is not significant because the intermodulation component becomes nearly zero when each polynomial coefficient is generated by adjusting the coefficient to minimize the intermodulation component.

In operation, the circuit of FIG. 2 is initially set to a calibration mode in which the multiplexer 55 first outputs a zero value to the polynomial generator. For generating the zero-order coefficient $a_0$ so that the analog output 48 is zero when the digital input 42 is zero, the switching modulator 58 is enabled by a signal $f_c$ to chop any DC component of the analog output 48. The switching modulator, for example, chops at 4 Hz rate equal to the center frequency of the digital band-pass filter 66. Any 4 Hz component generated by chopping any DC component is passed by the digital band-pass filter 66 and is detected by the amplitude detector 56. The polynomial coefficient generator 60 adjusts the coefficient $a_0$ so that any 4 Hz component is eliminated. During the adjustment process, and from this point on, the polynomial generator 52 adds the coefficient $a_0$ to the input (x), to form the polynomial that is converted by the digital delta-sigma modulator 43. This completes the offset cancellation. The switching modulator 58 is turned off so as to pass signals without modification; for example, the chopping signal ($f_c$) is changed from a 4 Hz binary signal to a constant logic level to disable the switching modulator.

For generating the second-order coefficient $a_2$, the digital oscillator 54 is set to frequencies, for example, of 500 Hz and 496 Hz, each having an amplitude of a little below one-half of full scale. These two frequencies are each about half of the cut-off frequency of the low-pass filter 45, which is, for example, about 1000 kHz. The multiplexer 55 selects the output of the dual-tone digital oscillator and passes the output to the input (x) of the polynomial generator 52. For an initial value of $a_2$ equal to zero, any second-order non-linearity in the forward path (the combination of the interpolation filter 41, the digital delta-sigma modulator 43, the single-bit DAC 44, the low-pass filter 45, and the driver 47) causes a 4 Hz intermodulation component to appear on the terminal 65. The analog-to-digital converter 59 receives the signal on the terminal 65 and converts it to a series of digital values provided to the digital band-pass filter 66 and the amplitude detector 56. The amplitude detector detects any 4 Hz intermodulation component passing through the digital band-pass filter 66, and the polynomial coefficient generator 60 adjusts the second-order polynomial coefficient $a_2$ so as to eliminate any detected 4 Hz component. During this time, and from this point on, the polynomial generator 52 multiplies the coefficient $a_2$ by the square of the input signal (x) and adds the product to the input (x), to form the polynomial that is converted by the digital delta-sigma modulator 43. This process is repeated to adjust the second-order polynomial coefficient $a_2$ to the best possible value in sign and magnitude for a set number of iterations or until the amplitude of the detected 4 Hz signal drops below a predetermined level.

For generating the third-order coefficient $a_3$, the digital oscillator 54 is set to frequencies of 500 Hz and 248 Hz, each having an amplitude of a little below one-half of full scale. For an initial value of $a_3$ equal to zero, any third-order non-linearity in the forward path (the combination of the interpolation filter 41, the digital delta-sigma modulator 43, the single-bit DAC 44, the low-pass filter 45, and the driver 47) causes a 4 Hz intermodulation component to appear on the terminal 65. The analog-to-digital converter 59 receives the signal on the terminal 65 and converts it to a series of digital values provided to the digital band-pass filter 66. The amplitude detector detects any 4 Hz intermodulation component passing through the digital band-pass filter 66, and the polynomial coefficient generator 60 adjusts the third-order polynomial coefficient $a_3$ so as to eliminate any detected 4 Hz component. During this time, and from this point on, the polynomial generator 52 multiplies the coefficient $a_3$ by the cube of the input signal (x) and adds the product to the input (x), to form the polynomial that is converted by the digital delta-sigma modulator 43. This process is repeated to adjust the third-order polynomial coefficient $a_3$ to the best possible value in sign and magnitude for a set number of iterations or until the amplitude of the detected 4 Hz signal drops below a predetermined level.

This procedure could be continued to correct for fourth and higher-order nonlinearity by appropriate selection of frequencies of the digital oscillator 54, but correction of such higher-order nonlinearity would typically not be necessary in the system of FIG. 2, because the higher-order distortion components, as well as the lower-order components, would be below the noise floor after the above calibration procedure.

Finally, the multiplexer 55 is switched to select the output of the interpolation filter 41. This completes the DAC calibration procedure.

Figure 3:
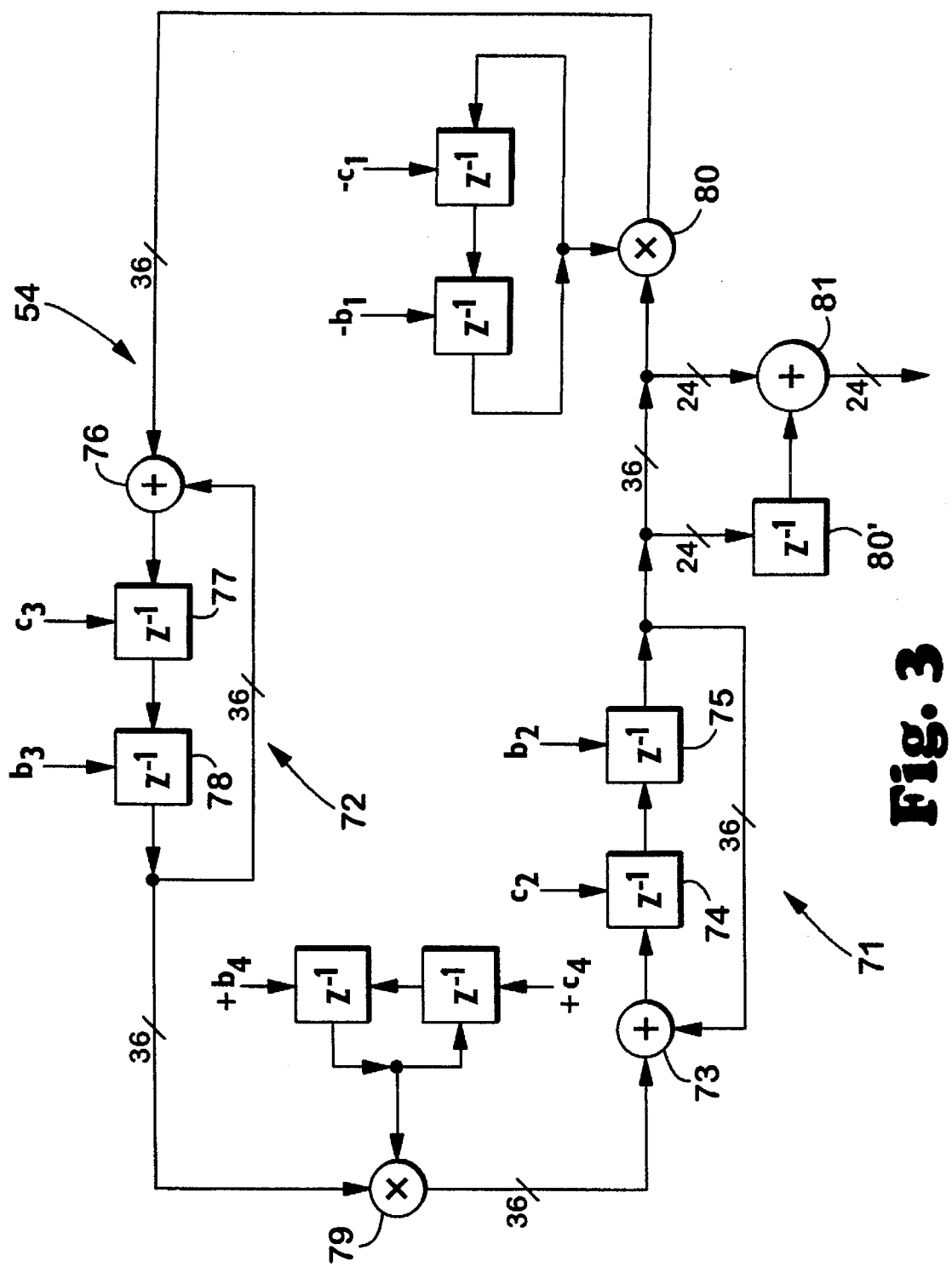
FIG. 3 is a schematic diagram showing details of the dual-tone digital oscillator introduced in FIG. 2.

Turning now to FIG. 3, there is shown a schematic diagram of the dual-tone digital oscillator 54. This schematic diagram is shown in digital filter representation. As is well known in the art, this representation is a specification for digital circuits which could be implemented in either dedicated hardware arranged as shown in FIG. 3, or in a digital signal processor programmed to perform the operations shown in FIG. 3 by executing a series of add, subtract, multiply, shift, load, store, input, output, or other instructions upon digital values in specified registers or addressable memory locations.

The oscillator 54 is based on a standard "coupled form" of a recursive second-order digital filter section. See, for example, FIG. 4.46 on page 109 and FIG. 10.10 on page 273 of Van Den Enden, *Discrete-Time Signal Processing*, Prentice Hall International (UK) Ltd., Hartfordshire, United Kingdom, 1989, incorporated herein by reference. In order to generate two tones, however, the delay units in the feedback loop of the oscillator 54 are duplicated so that computations for each of the two tones are computed during alternate sample times. The computations are performed to 36 bits of precision in order to obtain fine resolution in frequency selection. The "/36" in FIG. 3 indicates that the buses in the feedback loop carry 36 bits. The feedback loop includes a first accumulator generally designated 71 and a second accumulator generally designated 72. The first accumulator includes an adder 73, a first register 74, and a second register 75. In a similar fashion, the second accumulator 72 includes an adder 76, a first register 77, and a second register 78. The two accumulators are cross-coupled by a first multiplier 79 and a second multiplier 80. On alternate sample times, the first and second multipliers 79 and 80 multiply by a factor of $+b_4$ and $-b_1$, respectively, or $+c_4$ and $-c_1$, respectively. The values of the constant $b_1$ and $b_4$ determine the frequency of oscillation of the first tone, and the values of the constants $c_1$ and $c_4$ determines the frequency of the second tone. In particular, the frequency $\omega_o$, amplitude, and initial phase $\theta$ of the first tone is given by:

$$\omega_o = \begin{cases} \frac{1}{T} \cos^{-1}\left(1 - \frac{b_1 b_4}{2}\right) & \text{for } 0 < b_1 b_4 \leq 2 \\ \frac{1}{T}\pi - \frac{1}{T} \cos^{-1}\left(1 - \frac{b_1 b_4}{2}\right) & \text{for } 2 < b_1 b_4 < 4 \end{cases}$$

$$\theta = \tan^{-1}\left(\frac{b_2 \sin(\omega_o T)}{(1 - b_1 b_4 - \cos(\omega_o T))b_2 + b_4 b_3}\right)$$

$$\text{Amplitude} = \frac{(1 - b_1 b_4)b_2 + b_3 b_4}{\sin(\omega_o T + \theta)}$$

where T is the rate of computation of the alternate samples, which is one-half of the sampling rate of the registers in FIG. 3. If the constants "c" are substituted for the respective constants "b" in the above equations, the modified equations give the frequency $\omega_o$, amplitude, and initial phase $\theta$ of the second tone. A derivation of the above equations is found in A. K. Luet al., "A High-Quality Analog Oscillator Using Oversampling D/A Conversion Techniques," McGill University, Montreal, Canada, Jul. 19, 1993, to appear in IEEE Trans. on Circuits and Systems—II: Analog and Digital Signal Processing, Vol. 41, No. 7, July 1994.

The output of the oscillator 54 is provided by an adder 81 and a register 82 which add together the alternate frequency samples generated by the oscillator. The sum is truncated to 24 bits, indicated by the "/24" symbol in FIG. 3.

Preferably the two frequencies of the oscillator are selected so that at least one of the multipliers 79 and 80 can be implemented by just a shift instruction. In this case, the multiplier multiplies by a power of two. Preferably, the constants $b_1$ and $b_4$ are close to each other, such that the larger one is less than twice the other, and similarly the constants $c_1$ and $c_4$ are close to each other, such that the larger one is less than twice the other.

Figure 4:
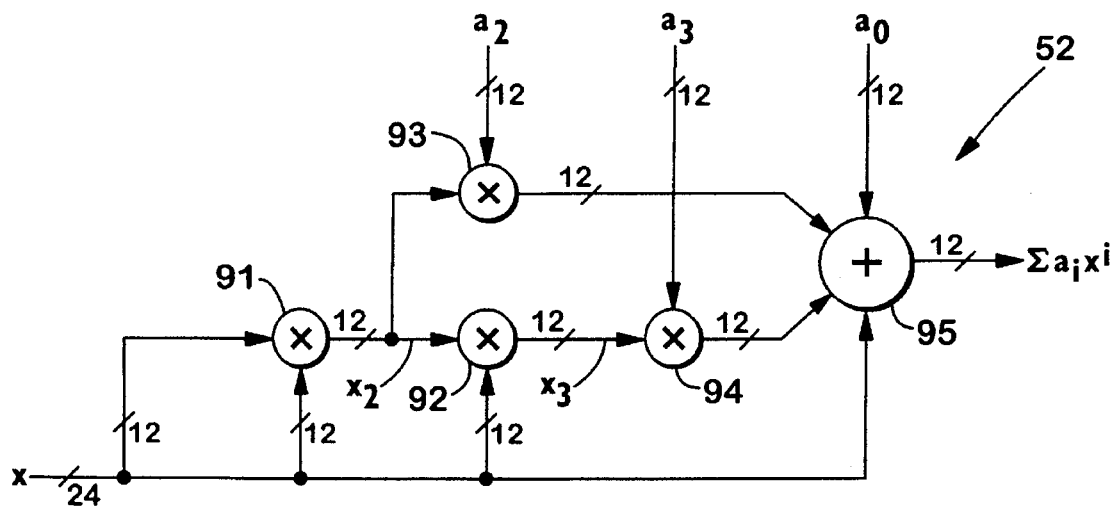
FIG. 4 is a schematic diagram showing the polynomial generator introduced in FIG. 2.

Turning now to FIG. 4, there is shown a schematic diagram of the polynomial generator 52. The input signal (x) is squared in a first multiplier 91, and cubed in a second multiplier 92. A third multiplier 93 computes the quadratic term $a_2 x^2$ and a fourth multiplier 94 computes a cubic term $a_3 x^3$. An adder 95 sums the quadratic term, the cubic term, a zero-order term $a_0$, and the input signal (x) to compute the polynomial $\Sigma a_i x^i$. In this example, the linear coefficient $a_1$ is equal to one, and no terms of higher order than the cubic term are included in the polynomial for the generator shown in FIG. 4. The polynomial generator of FIG. 4 could be modified to include additional terms by adding two additional multipliers for each additional term; one of the additional multipliers would compute the next higher power of (x), and the other additional multiplier would multiply the next higher power of (x) by the next higher-order coefficient and provide the product to the adder 96. The word lengths shown in FIG. 4 are sufficiently long to compensate for the amount of distortion expected in the components in the forward path following the polynomial generator (i.e., the digital delta-sigma modulator 43, the single-bit DAC 44, the low-pass filter 45, and the driver 47) in FIG. 2.

Figure 5:
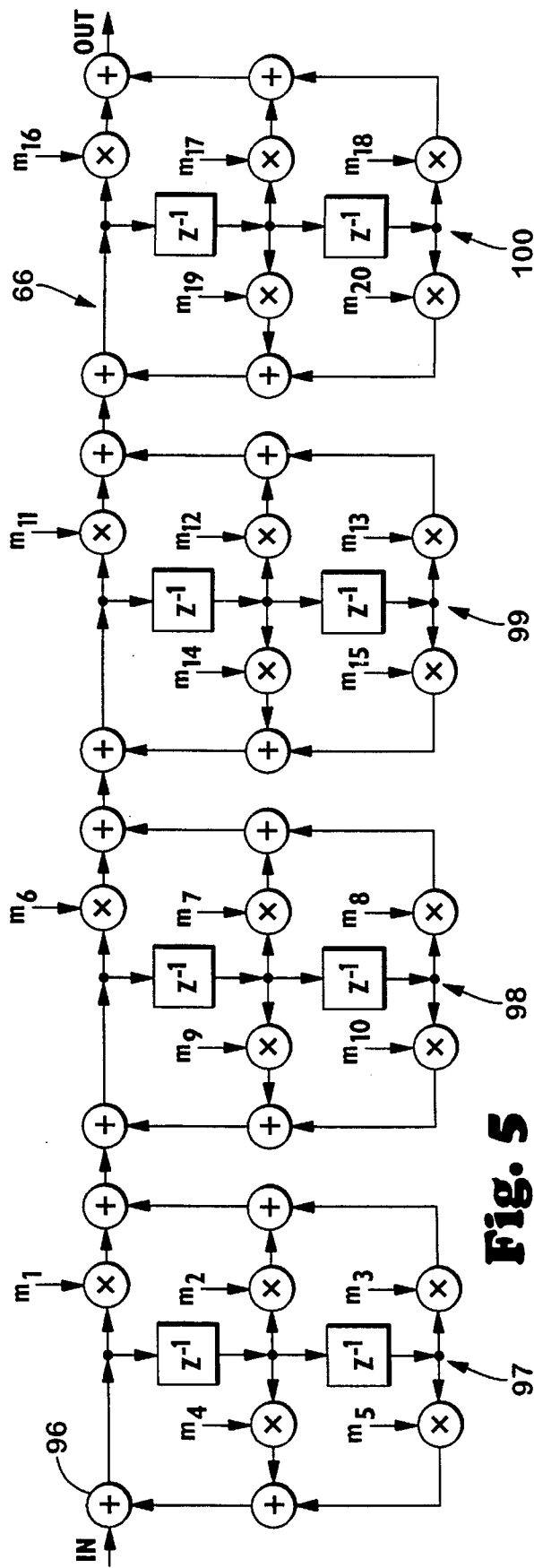
FIG. 5 is a schematic diagram of a digital band-pass filter introduced in FIG. 2.

Turning now to FIG. 5, there is shown a block diagram of the band-pass digital band-pass filter 66. As show, the digital band-pass filter is an eighth-order infinite-impulse response (IIR) filter having four cascaded second-order filter sections 97, 98, 99, 100. Each of the filter sections has feed-forward and feed-back paths from two accumulator registers. Preferably the digital filter constants $m_1$ to $m_{20}$ are selected for a Butterworth response with a 3.5 to 9.5 Hz bandwidth at a sample rate of 16,000 Hz. In this case, the digital filter constants have the following numerical values:

$m_1 = 9.838825570628316E{-}01$
$m_2 = -1.996765114125663E{+}00$
$m_3 = 9.838825570628316E{-}01$
$m_4 = 1.999769161853665E{+}00$
$m_5 = -9.977707013646913E{-}01$
$m_6 = 2.227017359215435E{-}14$
$m_7 = -4.454034718430869E{-}14$
$m_8 = 2.227017359215435E{-}14$
$m_9 = 1.999353885220964E{+}00$
$m_{10} = -9.993558843322849E{-}01$
$m_{11} = 1.000000000000000E{+}00$
$m_{12} = 2.000000000000000E{+}00$
$m_{13} = 1.000000000000000E{+}00$
$m_{14} = 1.999214696632831E{+}00$
$m_{15} = -9.992176455454043E{-}01$
$m_{16} = 1.000000000000000E{+}00$
$m_{17} = 2.000000000000000E{+}00$
$m_{18} = 1.000000000000000E{+}00$
$m_{19} = 1.999634483601468E{+}00$
$m_{20} = -9.996383143702203E{-}01$

The values listed above are given to greater precision than typically would be needed in the specific example of FIGS. 2 to 7. The precision of the registers and computations in the band-pass filter of FIG. 5, for example, is 24 or 32 bits.

Figure 6:
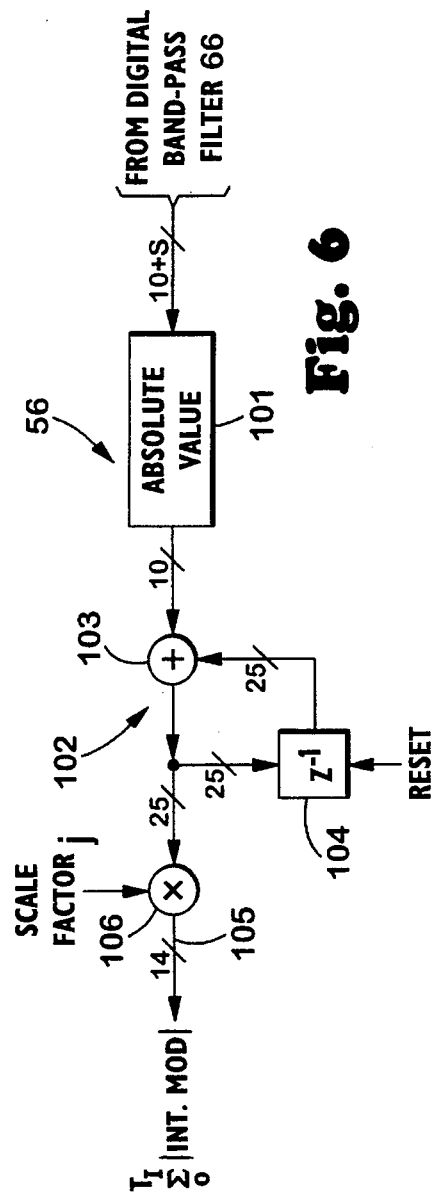
FIG. 6 is a schematic diagram of an amplitude detector introduced in FIG. 2 and which asynchronously detects an intermodulation component.

Turning now to FIG. 6, there is shown a schematic diagram of the amplitude detector 56 introduced in FIG. 2. The amplitude detector 56 includes an absolute value unit 101 having a construction depending on the particular number representation used. For example, if negative numbers are represented in "sign plus magnitude" format, then the absolute value unit simply discards the sign bit and passes the magnitude. If negative numbers are represented in "one's complement" or "two's complement" representation, then the absolute value unit may include a complement unit controlled by the sign bit to selectively complement the number, and the magnitude from the complement unit provides the absolute value. Such a complement unit is typically included in the "front end" of an arithmetic logic unit performing additions or subtractions. For the circuit shown in FIG. 6, for example, the addition 103 could be performed by such an arithmetic logic unit, and in this case, the absolute value 101 and adder 103 could be performed by such an arithmetic logic unit having an add/subtract control input receiving the sign bit(s) from the digital band-pass filter. In other words, in FIG. 6, when the digital band-pass filter provides a positive number to the circuit in FIG. 6, then this number is added to the result in the register 104 to compute the next value to be loaded back into the register 104, and when the digital band-pass filter provides a negative number to the circuit in FIG. 6, then this negative number is subtracted from the result in the register 104 to compute the next value to be loaded back into the register 104. The subtraction of a negative number gives the same result as the addition of the magnitude of the negative number, so that in either case, the output of the adder is the sum of the value in the register 104 and the absolute value of the output of the digital band-pass filter.

The adder 103 and register 104 comprise an accumulator for accumulating or averaging the magnitude of the samples from the digital band-pass filter 101. Other types of absolute value detectors, such as RMS detectors or energy detectors, could be used, but they are more complicated and are not warranted in this application. Accumulation over an integer number of half-cycles prevents the detected amplitude value from being dependent on the relative phase of the accumulation process with respect to the phase of the intermodulation component being detected. The register 104, for example, is initially reset at the beginning of the accumulation period.

Figure 7:
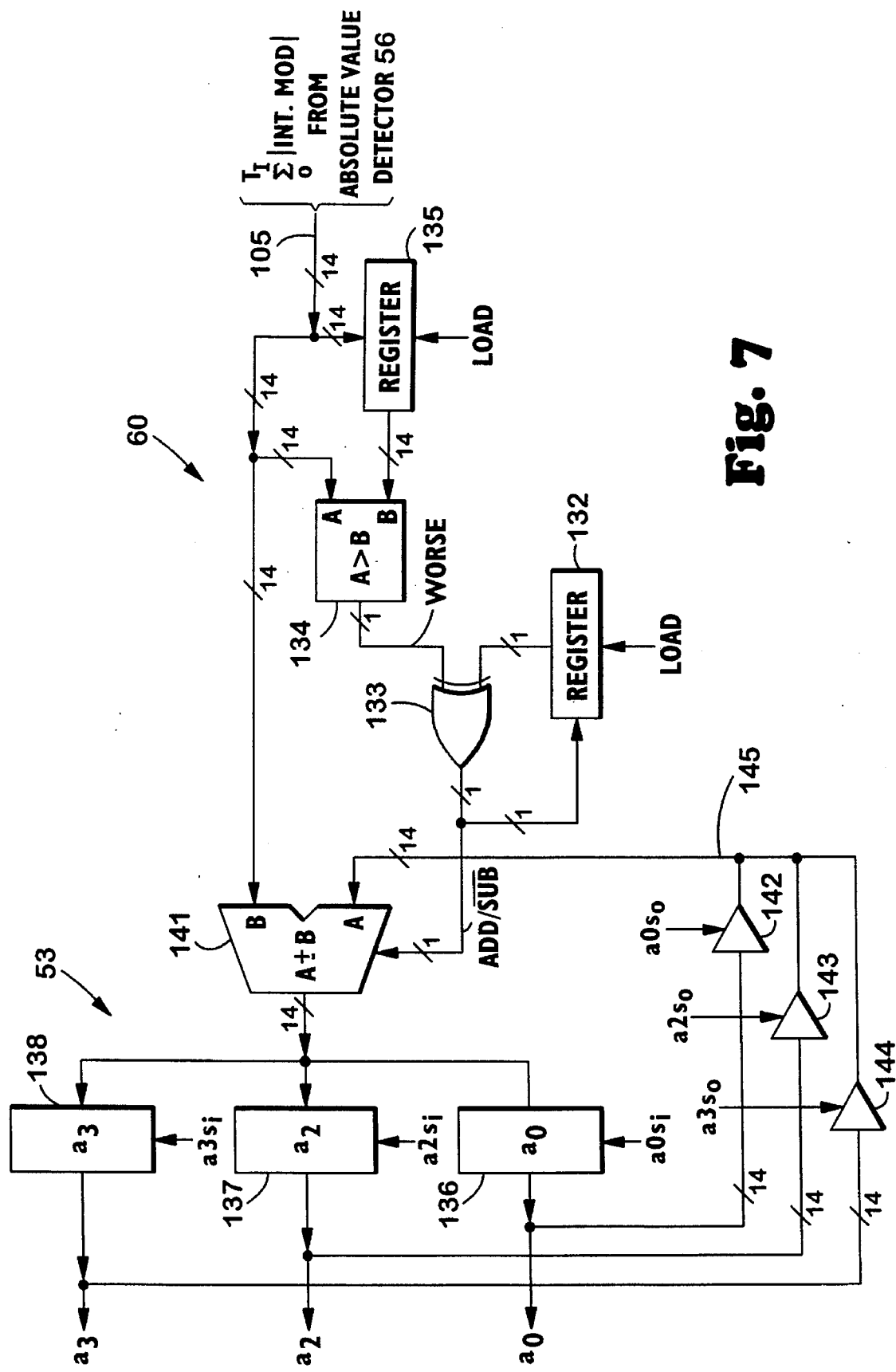
FIG. 7 is a schematic diagram of a polynomial coefficient generator and polynomial coefficient storage introduced in FIG. 2 and used with the asynchronous amplitude detector of FIG. 5.

The sum from the adder 103 of the accumulator 102 is scaled in a multiplier 106 by a predetermine scale factor, and passed over a bus 105 to the polynomial coefficient generator 60 shown in FIG. 7. The accumulator register 104 in FIG. 6 holds 25 bits, and after scaling by the multiplier, the fourteen most significant bits are passed to the bus 105.

The scale factor is chosen to maximize convergence, and its value is selected depending on the gain around the feedback loop in FIG. 2 for the polynomial coefficient being adjusted. In particular, the scale factor for the polynomial coefficient is chosen slightly less than an optimum amount that would make the predistortion exactly cancel the distortion in the forward loop after one iteration. The number of iterations required for convergence is dependent on how close the scale factor is set to the optimum amount.

Turning now to FIG. 7, there is shown a schematic diagram of the polynomial coefficient generator 60 to be used with the amplitude detector 56 of FIG. 5. As shown in FIG. 7, the 14-bit output of the absolute value detector on the bus 105 is received in an adder/subtractor unit 141 which either adds or subtracts the detected absolute value to the polynomial coefficient in a selected one of the polynomial coefficient storage registers 136, 137, 138 and loads the result back into the selected register. The output of a selected one of the registers 136, 137, 138 is selected by a respective one of the selection signals $a0s_o$, $a2s_o$, $a3s_o$, being asserted and thereby enabling a respective one of three tristate gates 142, 143, 144 to multiplex the polynomial coefficient from the selected register onto a bus 145 providing one of the inputs to the adder/subtractor 141. The output of the adder/subtractor 141 is loaded back into the selected one of the selected registers when a respective one of the register load signals $a0s_o$, $a2s_o$, $a3s_o$ is asserted.

Circuitry in FIG. 7 determines whether a new magnitude from the absolute value detector should be added or subtracted from the stored polynomial coefficient depending on whether an addition or subtraction was performed during the last iteration, and by checking whether the last change to the polynomial coefficient caused the magnitude to increase or decrease relative to the previous magnitude or magnitudes. A one-bit register 132 records whether an addition or subtraction was performed during the last iteration. An exclusive-OR gate 133 receives the output of the one-bit register to provide the add/subtract control signal to the adder/subtractor unit 141. A comparator 134 compares the absolute value from the bus 105 to the absolute value for the previous iteration, which is temporarily stored in a register 135.

If the absolute value on the bus 105 is decreasing, then the comparator 134 outputs a logic low, and the add/subtract control signal is not switched by the exclusive-OR gate. If the absolute value on the bus 105 is increasing, however, then the comparator 134 asserts a logic 1 and the exclusive OR gate switches the logic level of the add/subtract control signal. In this fashion, the polynomial coefficient is adjusted so as to reduce the detected intermodulation component to approximately zero. After a certain number of iterations, or after checking that the absolute value on the bus 105 is below a certain limit, the adjustment process is terminated. The final value of the polynomial coefficient is stored in a respective one of three registers 136, 137 and 138 in the polynomial coefficient storage 53. The residual value of the absolute value on the bus 105 upon termination of the adjustment process could also be stored for diagnostic purposes, such as reporting calibration errors, as described below with reference to FIG. 13.

Figure 8:
FIG. 8 is a graph illustrating convergence of a polynomial coefficient generated by the polynomial coefficient generator of FIG. 7.

Turning now to FIG. 8, there is shown a graph illustrating the convergence of a polynomial coefficient (a) to its final value ($a_f$) resulting from operation of the asynchronous amplitude detector 56 of FIG. 7 and the polynomial generator 60 of FIG. 8. The intermodulation product is at a frequency of approximately 4 Hz. The iteration time is on the order of 2 seconds per iteration. The scale factor in this example is set to 80% of its optimum value to better illustrate the convergence process. (In actual practice, the scale factor would be set to better than 90% of its optimum value.) Initially, the control signal to the adder/subtractor 141 was not in a state promoting convergence, causing the polynomial coefficient $a_x$ to be adjusted away from its desired final value $a_f$. Within five iterations, there is better than 50 dB reduction in the distortion (i.e., the difference between the adjusted value and the final value of the polynomial coefficient is 50 dB below the final value). If control signal to the adder/subtractor had been in an initial state promoting convergence, there would have been 56 dB of distortion reduction after 5 iterations. To further improve the distortion reduction, either a more optimum gain could be selected or more iterations could be performed. Transients in the feedback loop can be minimized by starting the two tones of the dual-tone oscillator 54 out of phase (i.e., one tone has an initial phase θ of zero and the other tone has an initial phase θ of π radians) so that the intermodulation component initially has a minimum value.

Figure 9:
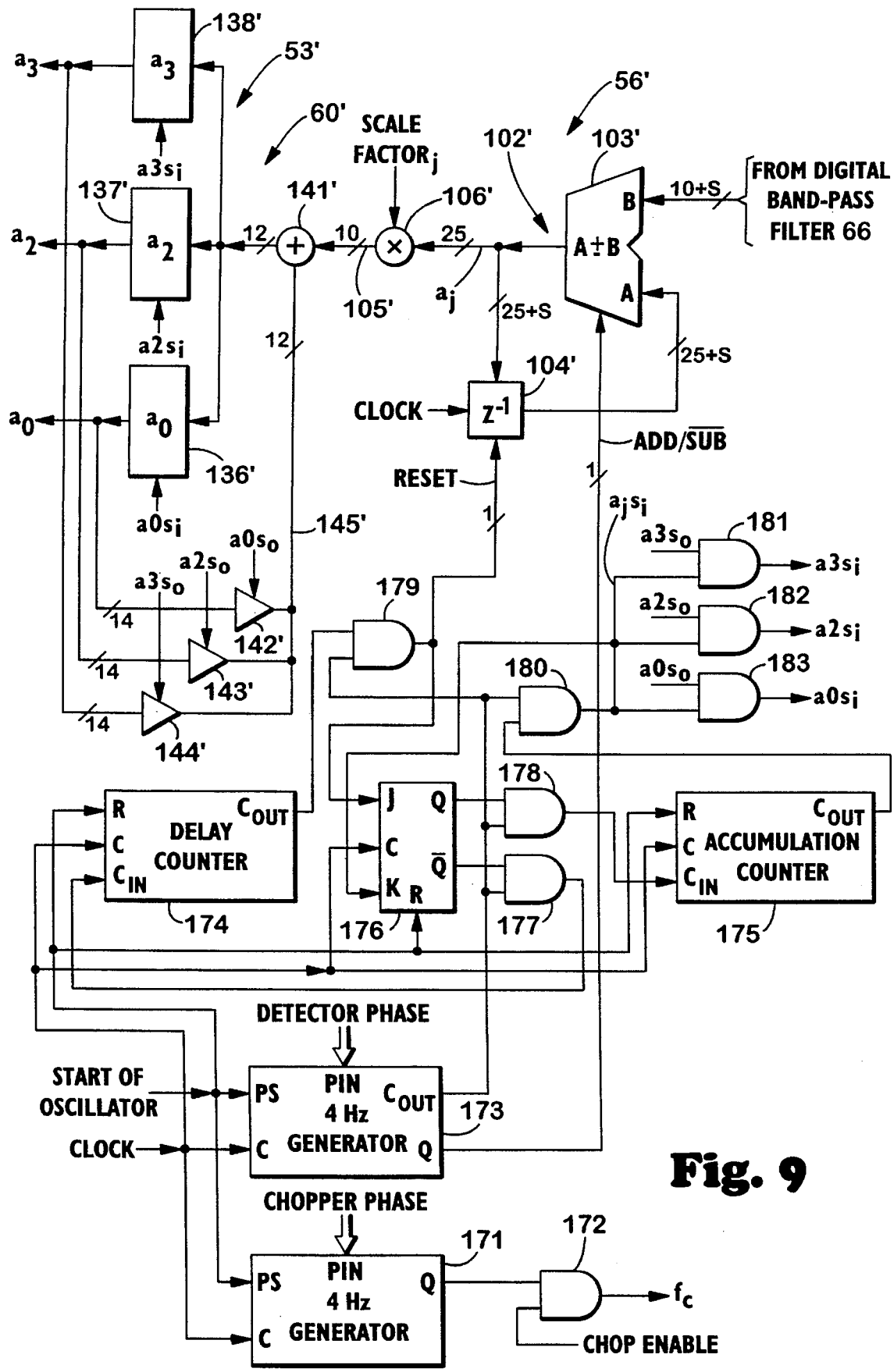
FIG. 9 is a schematic diagram of a synchronous amplitude detector, and a polynomial coefficient generator and polynomial coefficient storage for use with the synchronous amplitude detector.

Turning now to FIG. 9, there is shown a schematic diagram of a synchronous amplitude detector 56' and an associated polynomial coefficient generator 60' and polynomial coefficient storage 53', which could be used in lieu of the asynchronous amplitude detector 56 of FIG. 6 and its associated polynomial coefficient generator 60 and polynomial coefficient storage 53 of FIG. 7. Components in FIG. 9 that are similar to components in FIGS. 6 and 7 are denoted with similar but primed reference numerals.

The synchronous amplitude detector 56' requires knowledge of the phase of the intermodulation component to be detected. This knowledge is indicated by an "add/subtract" control signal to an adder/subtractor unit 103'. So long as the "add/subtract" control signal is synchronized to the intermodulation component, a proper sign and the magnitude of the intermodulation component will be accumulated in a register 194' and noise in the signal from the digital band-pass filter will be uncorrelated with the phase of the intermodulation component, thereby improving the detection signal-to-noise ratio.

The accumulator register 104' is initially reset, and is loaded in response to a clock at the sampling rate of the digital samples from the digital band-pass filter. After accumulation over an integral number of half-cycles at the 4 Hz frequency of the intermodulation component being detected, the accumulated result ($a_j$) is scaled in a multiplier 106' by a scale factor for a selected one of the polynomial coefficients. The polynomial coefficient is selected from a respective one of the registers 136', 137', 138' by a respective one of the selection signals $a0s_o$, $a2s_o$, $a3s_o$, being asserted and thereby enabling a respective one of three tristate gates 142', 143', 144' to multiplex the polynomial coefficient from the respective register onto a bus 145' providing one of the inputs to the adder 141'. The selected polynomial coefficient is adjusted by an adder 141' which adds the scaled result from the multiplier 106' to the selected polynomial coefficient. The adjusted polynomial coefficient is then stored back in its respective one of the storage registers 136', 137', 138' in response to a respective one of the register strobe signals $a0s_i$, $a2s_i$, $a3s_i$.

In order to synchronize the add/subtract control signal to the 4 Hz intermodulation component, the circuit in FIG. 9 includes a number of digital delays that are enabled at the start of the dual-tone digital oscillator (54 in FIG. 4). At the beginning of the process of generating each polynomial coefficient, the dual-tone digital oscillator is reset, so that the intermodulation component has a predetermined initial phase. So long as the delay around the feedback loop is relatively fixed and has a variation no greater than a small fraction of a period of the intermodulation component, then the add/subtract signal can be generated by a digital divider that is properly synchronized to the resetting and enabling of the oscillator.

As shown in FIG. 9, for example, the digital delays are generated by synchronous logic that is synchronized to a common clock and reset by a reset pulse at the start of the digital oscillator (54 in FIG. 2). The common clock in this case is at a multiple of 4 Hz, so that the 4 Hz chopping signal $f_c$ can be generated by a first digital counter 171 and a gate 172, and the add/subtract control signal to the adder/subtractor 103' can be generated by a second digital counter 173.

As shown in FIG. 9, the counters 171 and 173 are presettable counters that are preset with selected initial values at the start of the digital oscillator (54 in FIG. 2). The second counter 173 is loaded with an initial value that determines the phase of the synchronous detector relative to the start of the digital oscillator (54 in FIG. 2). In particular, the add/subtract signal is synchronized to the 4 Hz intermodulation component, as shown in the timing diagram in FIG. 10. The first counter 171 is loaded with an initial value that determines the phase of the chopping signal $f_c$ relative to the start of the digital oscillator (54 in FIG. 2). The phase of the chopping signal $f_c$ determines the phase of the modulated signal from the switching modulator (58 in FIG. 2). When the chopping signal $f_c$ is enabled, the modulated signal from the switching modulator (58 in FIG. 2) must also be synchronized to the add/subtract signal in a fashion similar to the synchronization of the intermodulation component, as shown in the timing diagram in FIG. 10.

Figure 10:
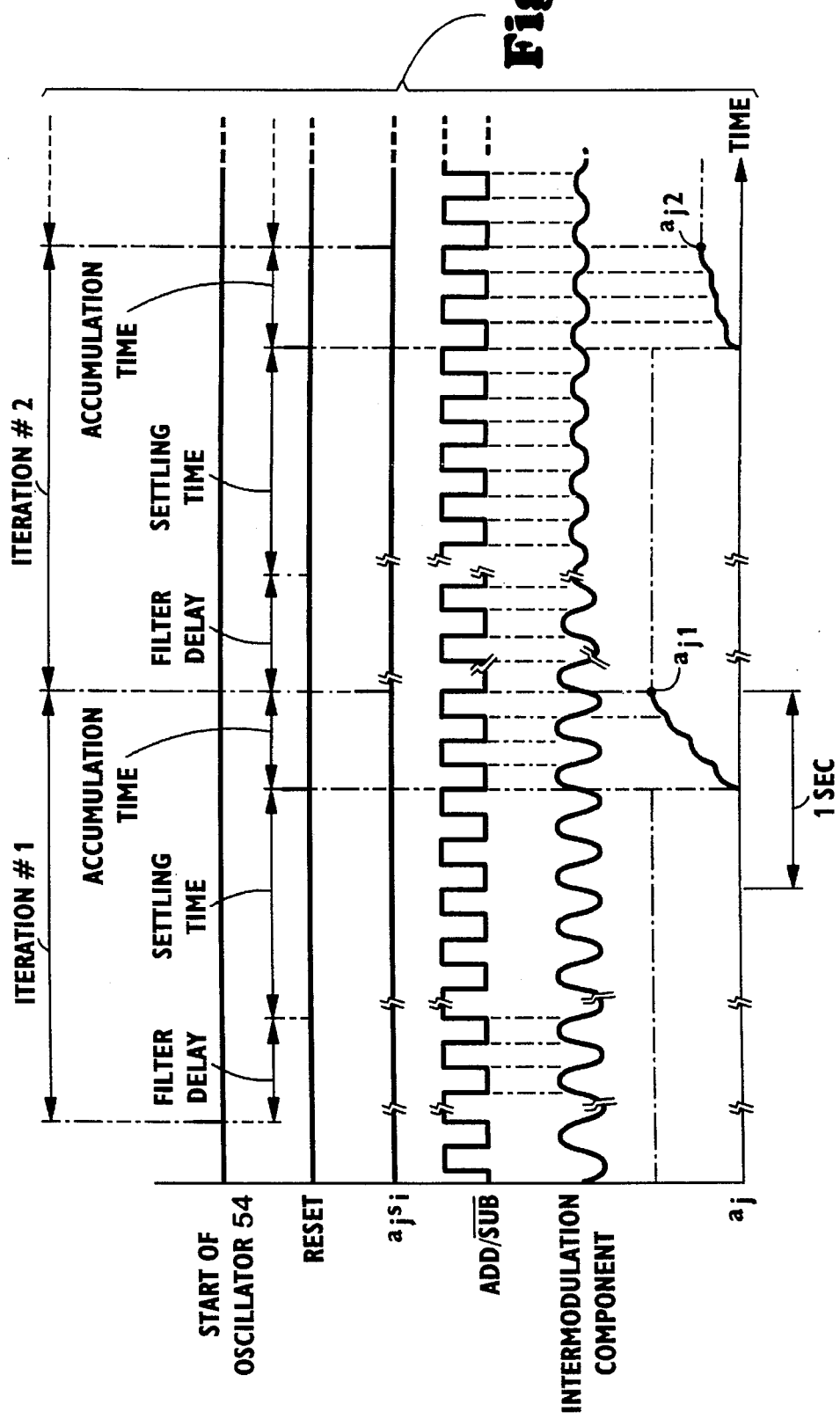
FIG. 10 is a timing diagram illustrating various signals in the synchronous detector circuits of FIG. 9.

As shown in FIG. 9, a delay counter 174 determines a delay time to account for filter delay and settling time, as shown in FIG. 10, and an accumulation counter 175 determines an accumulation time, as shown in FIG. 10. The state of a J-K flip-flop 176 enables counting by either the delay counter 174 at the beginning of an iteration or by the accumulation counter 175 at the end of an iteration. A set of four AND gates 177, 178, 179, 180 permits the counters 174 and 175 to count at a rate lower than the clock frequency; for example, the four AND gates 177, 178, 179, 180 are enabled by the carry-out signal ($C_{OUT}$) from the presettable counter 173 so that the counters 174 and 175 count at a 4 Hz rate when alternately enabled by the J-K flip-flop 176. For the example shown in the timing diagram of FIG. 10, the accumulation counter 175 counts up to two in order to accumulate over two cycles at the 4 Hz rate, and the delay counter 174 counts up to a larger number in order to provide a delay equal to filter delay (along the path through the multiplexer 55, polynomial generator 52, digital delta-sigma modulator 43, single-bit DAC 44, low-pass filter 45, driver 47, low-pass filter 57, switching modulator 58, the analog-to-digital converter 59, and the digital band-pass filter 66) plus settling time (sufficient for the intermodulation component to settle to a relatively constant amplitude).

The AND gate 179 gates the carry-out of the delay counter 174 to provide a reset signal to the accumulator register 104', and the AND gate 180 gates the carry-out of the accumulation counter 175 to provide a master strobe signal $ajs_i$. Respective AND gates 181, 182, 183 gate the master strobe signal $ajs_i$ with the respective polynomial coefficient selection signals $a0s_o$, $a2s_o$, $a3s_o$ to produce the respective strobe signals $a0s_i$, $a2s_i$, $a3s_i$. Therefore, during each iteration, the accumulator register 104' is reset and then accumulates values during an accumulation period, and at the end of the accumulation period, the selected polynomial coefficient is adjusted by the accumulated value. For example, as shown in FIG. 10, at the end of the accumulation period during the first iteration, the value $a_j$ in the accumulation register 104' is $a_{j1}$, and at the end of the accumulation period during the second iteration, the value $a_j$ in the accumulation register 104' is $a_{j2}$. The value $a_j$ in the accumulation register 104' during the filter delay and settling time is not relevant, because the register 104' is reset at the end of the settling time, and consequently the value $a_j$ in the register 104' is always zero at the beginning of the accumulation period.

Turning now to FIG. 11A, there is shown a schematic diagram of the switching modulator 58. In this case, the analog-to-digital converter 59 has a single-ended input 151. The switching modulator includes an NMOS transistor 152 and a PMOS transistor 152' connected between the terminal 65 and the input 151, and an NMOS transistor 153 and a PMOS transistor 153' shunting the input 151 to ground. The gates of the transistors 152 and 153' receive the chopping signal $f_c$, and the gates of the transistors 152' and 153 are connected to the output of an inverter 154 receiving the chopping signal.

Turning now to FIG. 11B, there is shown a schematic diagram of an alternative switching modulator 160 for use with an analog-to-digital converter 161 having complementary inputs 162 and 163. The switching modulator 160 has an NMOS transistor 164 and a PMOS transistor 164' connected between the terminal 65' and the positive input 162, and an NMOS transistor 165 and a PMOS transistor 165' connected between the positive input 162 and ground. The transistors 164 and 165' have their gates connected to receive the chopping signal $f_c$, and the transistors 164' and 165 have their gates connected to the output of an inverter 166 responsive to the chopping signal. The switching modulator 160 further includes an NMOS transistor 167 and a PMOS transistor 167' connected between the terminal 65' and the negative input 163, and an NMOS transistor 168 and a PMOS transistor 168' connected between the negative input 163 and ground. The transistors 167 and 168' have their gates connected to the output of the inverter 166, and the transistors 167' and 168 have their gates connected to receive the chopping signal $f_c$. Therefore, both the positive and negative inputs 162, 163 of the analog-to-digital converter 161 are periodically switched at the chopping frequency $f_c$ between the terminal 65' and ground.

Figure 12A:
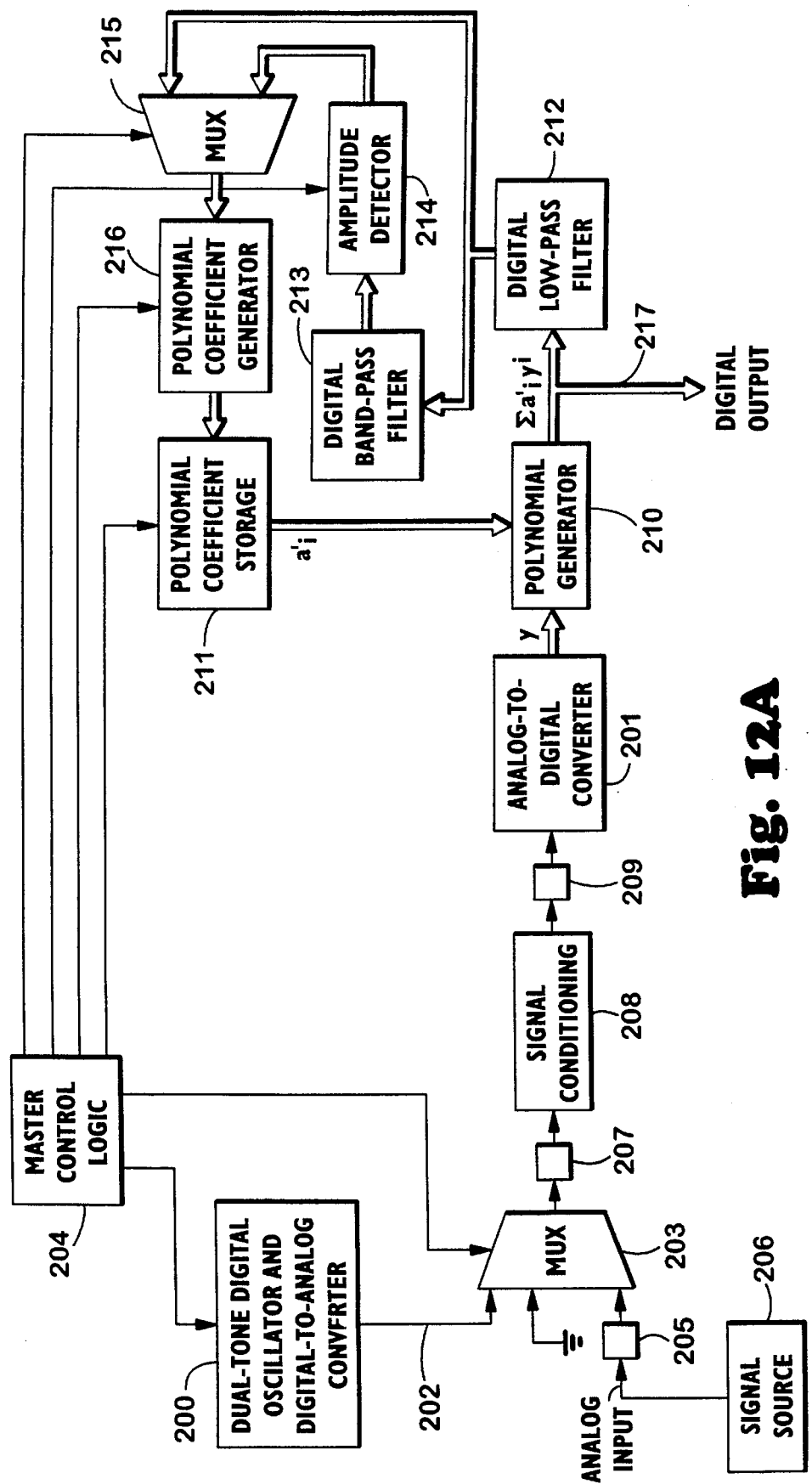
FIG. 12A is a block diagram of a first embodiment of an analog-to-digital converter including circuitry for digital compensation of nonlinearity.

Turning now to FIG. 12A, there is shown a schematic diagram of an analog-to-digital converter system including a dual-tone digital oscillator and calibrated digital-to-analog converter 200 for calibrating the analog-to-digital converter system. The dual-tone digital oscillator and digital-to-analog converter 200 include components similar to the components shown in FIG. 2, which are used as described above for calibrating the digital-to-analog converter to be ultralinear prior to calibration of the analog-to-digital converter system. The analog-to-digital converter system has a forward signal path including an analog input multiplexer 203, signal conditioning 208 (which may or may not be needed in any particular application), an analog-to-digital converter 201, and a polynomial generator 210. Preferably the analog-to-digital converter 201 is a delta-sigma converter including a delta sigma modulator generating a one-bit data stream at a high rate, and a digital decimating filter responsive to the one-bit data stream at the high rate for producing a multi-bit digital output at a lower rate.

For calibrating the analog-to-digital converter system of FIG. 12A, the components in box 200 generate an analog signal 202 including a pair of very precise sinusoidal signals. This is possible because the digital-to-analog converter in the box 200 has been calibrated as described above to correct any nonlinearity.

During a normal mode of operation, the analog input multiplexer 203 is operated by master control logic 204 to select an analog input signal on a terminal 205. The master control logic, for example, is a programmed microprocessor. As shown in FIG. 12A, the analog input signal is provided by a signal source 206. Typical signal sources include a geophone, a hydrophone, a microphone, a strain gauge, or a transducer such as a pressure transducer.

The signal selected by the multiplexer 203 is provided to a terminal 207 to which a signal conditioning circuit 208 is connected. The signal conditioning circuit 208, for example, is an amplifier, filter or transducer. The components shown in FIG. 12A other than the signal conditioning circuit 208 and the dual-tone oscillator 200 preferably are fabricated on a single monolithic semiconductor integrated circuit chip. The signal conditioning circuit 208 has an output connected to a terminal 209. The terminal 209 is connected to the input of the analog-to-digital converter 201. The output (y) of the analog-to-digital converter 201 is provided to a polynomial generator 210 that also receives polynomial coefficients $a'_i$ from polynomial coefficient storage 211. A polynomial generator 210 generates a polynomial $\Sigma a'_i y^i$ that is a corrected digital output 217 of the analog-to-digital converter 201.

The polynomial coefficients $a'_i$ are generated in a fashion analogous to the polynomial coefficients $a_i$ generated in the system of FIG. 2. In other words, the polynomial coefficients $a'_i$ are generated to correct any nonlinearity in the combination of the signal conditioning circuit 208 and the analog-to-digital converter 201 by detecting harmonic or intermodulation components and adjusting the polynomial coefficients to minimize these harmonic or intermodulation components.

The digital output of the polynomial generator 210 is filtered by a digital low-pass filter 212 to obtain a digital signal analogous to the digital signal from the analog-to-digital converter 59 in FIG. 2. The digital low-pass filter 212, for example, has a cut-off frequency of about 4 Hz. The digital low-pass filter could also decimate the digital samples at the digital output 217. For example, if the sampling rate at the digital output were 4,048 Hz, then the digital low-pass filter could decimate to a rate of 64 Hz. The output of the digital low-pass filter 212 is provided to a digital band-pass filter 213 and an amplitude detector 214 for detecting 4 Hz intermodulation components. The output of the digital low-pass filter 212 is also provided to a bypass multiplexer 215. The digital band-pass filter 213 and the amplitude detector 214 are similar or identical to the amplitude detector 56 and the digital band-pass filter 66 of FIG. 2. The output of the amplitude detector 214 is received by the bypass multiplexer 215. The output of the multiplexer 215 is received by a polynomial coefficient generator 216 which generates the polynomial coefficients that are stored in the polynomial coefficient storage 211. The polynomial coefficient generator 216 is similar or identical to the polynomial coefficient generator 60 shown in FIG. 2.

In operation, during an ADC calibration mode, the master control 204 first operates the multiplexer 203 to select a ground or zero voltage level and apply the zero voltage level to the terminal 207 in order to generate the polynomial coefficient $a'_0$. Alternatively, the analog input multiplexer 203 could select the output of the dual-tone digital oscillator, and the master control could load zero values into the digital oscillator, so that the digital oscillator would output a zero voltage level to the analog input multiplexer, which would appear on the terminal 207. The master control 204 also controls the bypass multiplexer 215 to bypass the digital band-pass filter 213 and the amplitude detector 214 by selecting the output of the digital low-pass filter 212. The polynomial coefficient generator 216 adjusts the polynomial coefficient $a'_0$ in response to the value from the amplitude detector 214 and provides the adjusted value to the polynomial generator. Due to the feedback loop including the components 210, 211, 212, 215 and 216, the polynomial coefficient $a'_0$ converges to a final value such that the digital output 217 of the polynomial generator 210 is zero. Generation of the polynomial coefficient $a'_0$ is therefore finished, and its final value is stored in the polynomial coefficient storage 211.

In order to generate the second-order polynomial coefficient $a'_2$, the master control logic 204 sets the digital oscillator to frequencies of 500 Hz and 496 Hz, each having an amplitude of a little below one-half of full scale. For an initial value of $a'_2$ equal to zero, any second-order nonlinearity in the combination of the signal conditioning circuit 208 and the analog-to-digital converter 201 causes a 4 Hz intermodulation component to appear in the digital output 217. The digital low-pass filter 212 passes any 4 Hz intermodulation component, but rejects the 500 and 496 Hz tones, and any harmonics or other intermodulation components. Any 4 Hz intermodulation component is selected by the digital band-pass filter 213 and detected by the amplitude detector 214. The master control logic 204 controls the bypass multiplexer 215 to select the output of the amplitude detector 214 and to pass this output to the polynomial coefficient generator 216. The polynomial coefficient generator 216 adjusts the second-order polynomial coefficient $a'_2$ so as to eliminate any detected 4 Hz component. During this time, and from this point on, the polynomial generator 210 multiplies the coefficient $a'_2$ by the square of the input signal (y) and adds the product to the input (y), to form the polynomial signal that provides the digital output 217.

For generating the third-order coefficient $a'_3$, the master control 204 sets the digital oscillator 200 to frequencies of 500 Hz and 248 Hz, each having an amplitude of a little below one-half of full scale. For an initial value of $a'_3$ equal to zero, any third-order non-linearity in combination of the signal conditioning circuits 208 and the analog-to-digital converter 201 causes a 4 Hz intermodulation component to appear in the digital output 217. Any 4 Hz intermodulation component passes through the digital low-pass filter 212 and is selected by the digital band-pass filter 213 and detected by the amplitude detector 214. The output of the amplitude detector 214 is selected by the multiplexer 215 and is passed to the polynomial coefficient generator 216. The polynomial coefficient generator 216 adjusts the third-order polynomial coefficient $a'_3$ so as to eliminate any detected 4 Hz component. During this time, and from this point on, the polynomial generator 210 multiplies the coefficient $a'_3$ by the cube of the input signal (y) and adds the product to the input (y), to form the digital output 217.

This procedure could be continued to correct for fourth and higher-order nonlinearity by appropriate selection of frequencies of the digital oscillator 200, but correction of such higher-order nonlinearity would typically not be necessary in the system of FIG. 12A.

Finally, the master control 204 controls the analog input multiplexer 203 to select the analog input 205. This completes the procedure for calibrating the analog-to-digital converter system. It is also possible for the dual-tone digital oscillator and digital-to-analog converter to simultaneously calibrate a plurality of analog-to-digital converters by following this procedure. For simultaneous calibration, the components 203, 201, 210, 211, 212, 213, 214, 215, and 216 would be duplicated for each analog-to-digital converter. In this case, the zero-order coefficients would be computed simultaneously for the plurality of analog-to-digital converters, then the second-order coefficients would be computed simultaneously, and then the third-order coefficients would be computed simultaneously. Such an array of calibrated analog-to-digital converters would be useful for converting geophone signals for seismic exploration.

After calibration of the analog-to-digital conversion system in FIG. 12A to compensate for non-linearity, the polynomial coefficients in the storage 211 could be adjusted to obtain a desired non-linear response. The desired non-linear response could be selected for a desired degree of compression or decompression of the analog input signal. The desired non-linear response could also be used to cancel distortion in the signal source. For example, the nonlinearity of transducers such as geophones, hydrophones, microphones, strain gauges and pressure transducers can be expressed as a polynomial, and this nonlinearity can be corrected by subtracting the coefficients of this polynomial from the respective coefficients in the storage 211 and storing the adjusted coefficients in the storage 211.

Figure 12B:
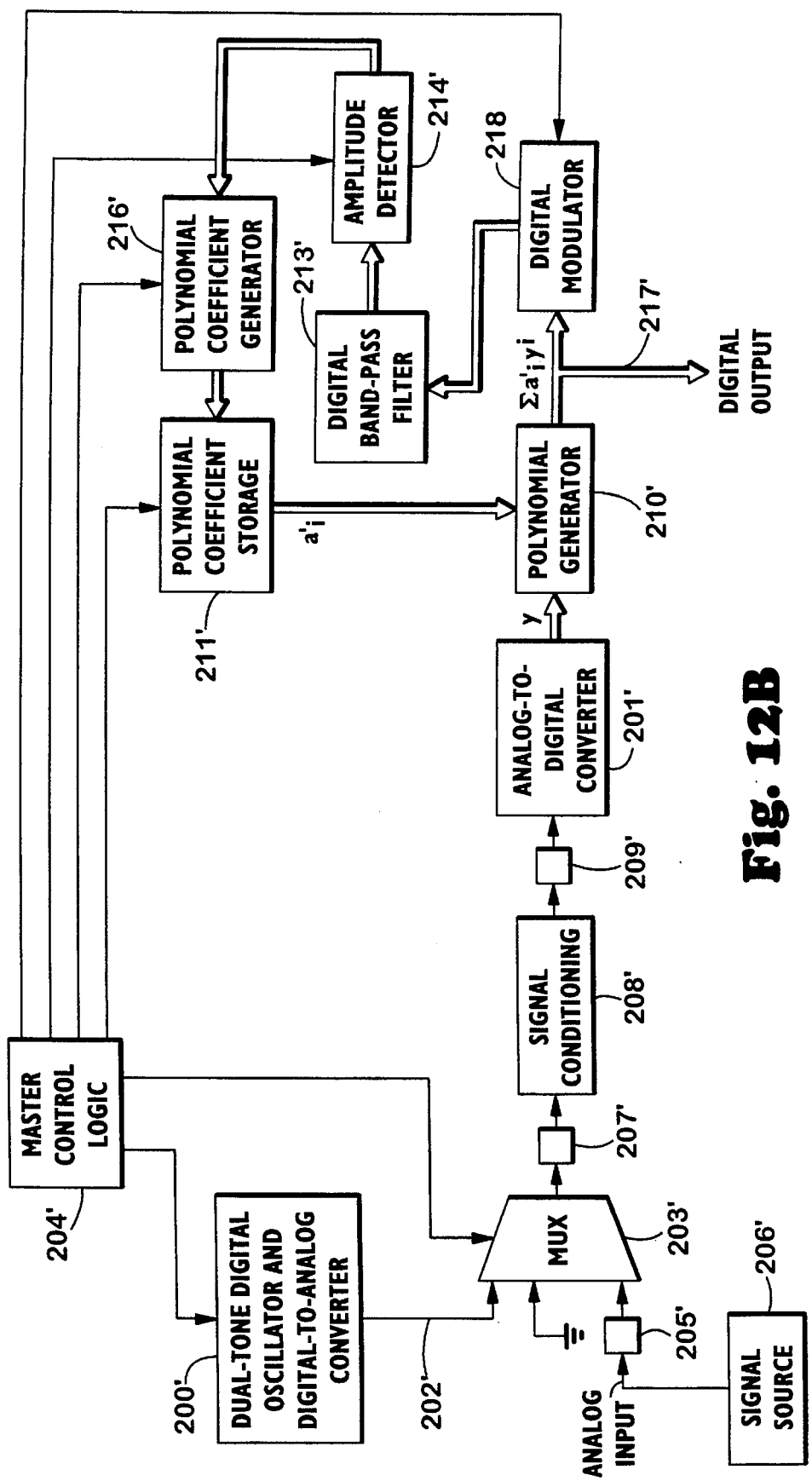
FIG. 12B is a block diagram of a second embodiment of an analog-to-digital converter including circuitry for digital compensation of nonlinearity.

Turning now to FIG. 12B, there is shown a schematic diagram of an alternative analog-to-digital converter system including a dual-tone digital oscillator and calibrated digital-to-analog converter 200' for calibrating the analog-to-digital converter system. The system is similar to the system in FIG. 12A, and similar components are designated with similar but primed reference numerals. It should be apparent that the digital low-pass filter 212 of FIG. 12A has been replaced by a digital modulator 218 in FIG. 12B, and the system of FIG. 12B does not have a multiplexer similar to the multiplexer 215 of FIG. 12A. The operation of the system in FIG. 12B is similar to the operation of the system in FIG. 12A, except that when the multiplexer 215 of FIG. 12A selects the output of the amplitude detector 214 in FIG. 12A, the corresponding operation in the system of FIG. 12B is for the master control logic 204' to disable the digital modulator 218, and when the multiplexer 215 of FIG. 12A selects the output of the digital low-pass filter 212, the corresponding operation in the system of FIG. 12B is for the master control logic 204' to enable the digital modulator. These differences between the system of FIG. 12A and the system of FIG. 12B primarily relate to the calibration of the analog-to-digital conversion in the system of FIG. 12B.

For calibrating the analog-to-digital converter system of FIG. 12B, the components in box 200' generate an analog signal 202' including a pair of very precise sinusoidal signals. This is possible because the digital-to-analog converter in the box 200' has been calibrated as described above to correct any nonlinearity.

During a normal mode of operation, the analog input multiplexer 203' is operated by the master control logic 204' to select an analog input signal on a terminal 205'. As shown in FIG. 12B, the analog input signal is provided by a signal source 206'. The signal selected by the multiplexer 203 is provided to a terminal 207' to which a signal conditioning circuit 208' is connected. The signal conditioning circuit 208' has an output connected to a terminal 209'. The terminal 209' is connected to the input of the analog-to-digital converter 201'. The output (y) of the analog-to-digital converter 201' is provided to a polynomial generator 210' that also receives polynomial coefficients $a'_i$ from polynomial coefficient storage 211'. A polynomial generator 210' generates a polynomial $\Sigma a'_i y^i$ that is a corrected digital output 217' of the analog-to-digital converter 201'.

When computing the coefficient $a'_0$, the digital output of the polynomial generator 210' is modulated by the digital modulator 218 to obtain a digital signal analogous to the digital signal from the analog-to-digital converter 59 in FIG. 2. The output of the digital modulator 218 is provided to a digital band-pass filter 213' and an amplitude detector 214' for detecting the modulated dc component for computing the $a'_0$ coefficient or for detecting the 4 Hz intermodulation components for computing the $a'_2$ and $a'_3$ coefficients (and any higher order coefficients if used in the system). The digital band-pass filter 213' and the amplitude detector 214' are similar or identical to the amplitude detector 56 and the digital band-pass filter 66 of FIG. 2. The output of the amplitude detector 214' is received by a polynomial coefficient generator 216' which generates the polynomial coefficients that are stored in the polynomial coefficient storage 211'. The polynomial coefficient generator 216' is similar or identical to the polynomial coefficient generator 60 shown in FIG. 2.

In operation, during an ADC calibration mode, the master control 204' first operates the multiplexer 203' to select a ground or zero voltage level and apply the zero voltage level to the terminal 207' in order to generate the polynomial coefficient $a'_0$. Alternatively, the analog input multiplexer 203' could select the output of the dual-tone digital oscillator, and the master control could load zero values into the digital oscillator, so that the digital oscillator would output a zero voltage level to the analog input multiplexer, which would appear on the terminal 207'. The master control. 204' also controls the digital modulator 218 to modulate the zero input voltage digital signal at the center frequency of the band-pass filter 213'. The polynomial coefficient generator 216' adjusts the polynomial coefficient $a'_0$ in response to the value from the amplitude detector 214' and provides the adjusted value to the polynomial generator. Due to the feedback loop including the components 210', 211', 212', 213', 214', and 216' the polynomial coefficient $a'_0$ converges to a final value such that the digital output 217' of the polynomial generator 210' is zero. Generation of the polynomial coefficient $a'_0$ is therefore finished, and its final value is stored in the polynomial coefficient storage 211'.

In order to generate the second-order polynomial coefficient $a'_2$, the master control logic 204' sets the digital oscillator to frequencies of 500 Hz and 496 Hz, each having an amplitude of a little below one-half of full scale. For an initial value of $a'_2$ equal to zero, any second-order non-linearity in the combination of the signal conditioning circuit 208' and the analog-to-digital converter 201' causes a 4 Hz intermodulation component to appear in the digital output 217'. The master control logic 204' controls the digital modulator 218 to pass all signals without modification from the digital output 217' to the digital band-pass filter 213'. The digital low-pass filter 212' passes any 4 Hz intermodulation component, but rejects the 500 and 496 Hz tones, and any harmonics or other intermodulation components. Any 4 Hz intermodulation component is selected by the digital band-pass filter 213' and detected by the amplitude detector 214'.

The output of the amplitude detector 214' is received by the polynomial coefficient generator 216'. The polynomial coefficient generator 216' adjusts the second-order polynomial coefficient $a'_2$ so as to eliminate any detected 4 Hz component. During this time, and from this point on, the polynomial generator 210' multiplies the coefficient $a'_2$ by the square of the input signal (y) and adds the product to the input (y), to form the polynomial signal that provides the digital output 217'.

For generating the third-order coefficient $a'_3$, the master control 204' sets the digital oscillator 200' to frequencies of 500 Hz and 248 Hz, each having an amplitude of a little below one-half of full scale For an initial value of $a'_3$ equal to zero, any third-order non-linearity in combination of the signal conditioning circuits 208' and the analog-to-digital converter 201' causes a 4 Hz intermodulation component to appear in the digital output 217'. Any 4 Hz intermodulation component passes through the digital low-pass filter 212' and is selected by the digital band-pass filter 213' and detected by the amplitude detector 214'. The output of the amplitude detector 214' is selected by the multiplexer 215' and is passed to the polynomial coefficient generator 216'. The polynomial coefficient generator 216' adjusts the third-order polynomial coefficient $a'_3$ so as to eliminate any detected 4 Hz component. During this time, and from this point on, the polynomial generator 210' multiplies the coefficient $a'_3$ by the cube of the input signal (y) and adds the product to the input (y), to form the digital output 217'.

This procedure could be continued to correct for fourth and higher-order nonlinearity by appropriate selection of frequencies of the digital oscillator 200, but correction of such higher-order nonlinearity would typically not be necessary in the system of FIG. 12B.

Finally, the master control 204' controls the analog input multiplexer 203' to select the analog input 205'. This completes the procedure for calibrating the analog-to-digital converter system in FIG. 12B. It is also possible for the dual-tone digital oscillator and digital-to-analog converter to simultaneously calibrate a plurality of analog-to-digital converters by following the procedure just described with reference to FIG. 12B. Moreover, after calibration of the analog-to-digital conversion system in FIG. 12B to compensate for non-linearity, the polynomial coefficients in the storage 211 could be adjusted as described above with reference to FIG. 12A to obtain a desired non-linear response.

Figure 13:
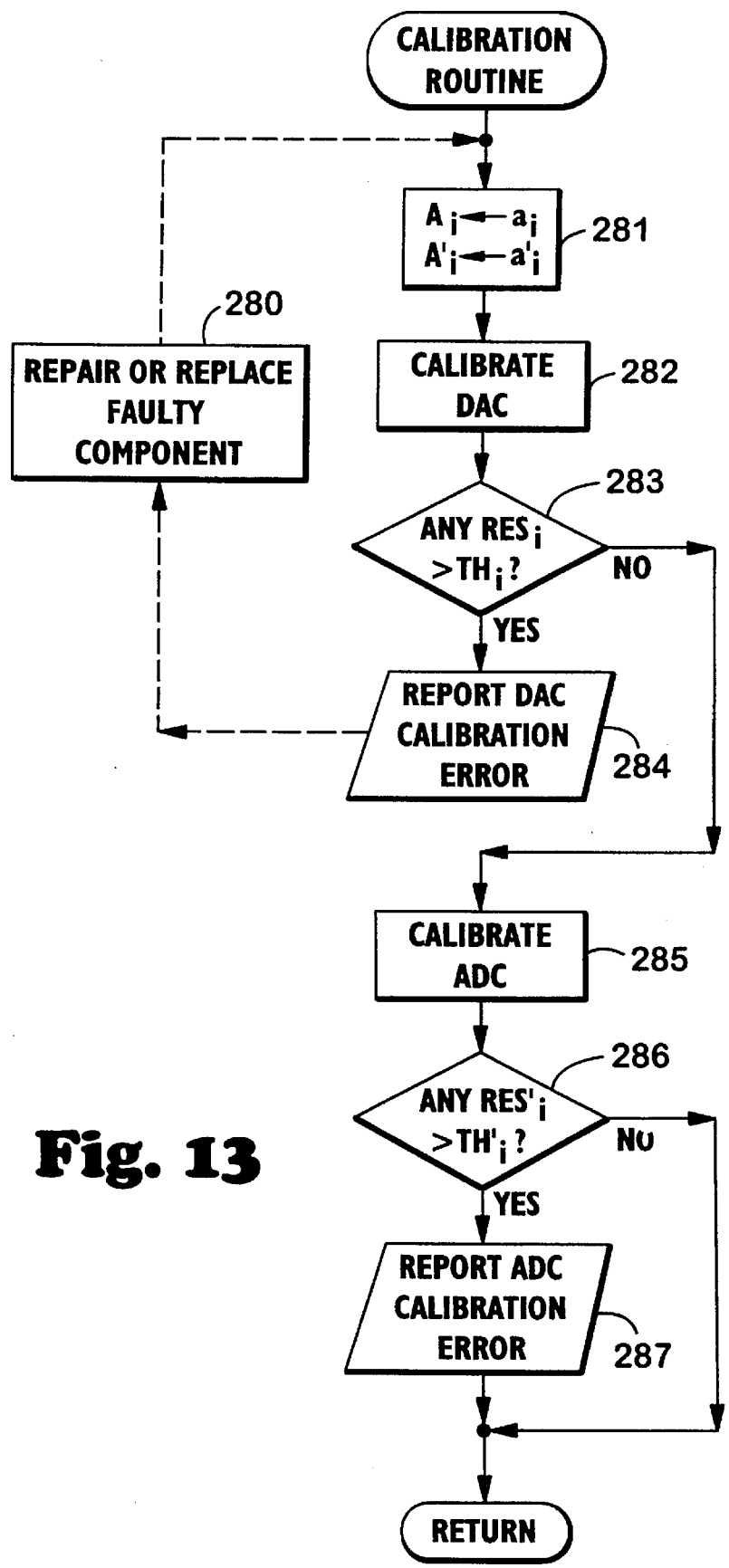
FIG. 13 is a flowchart of a routine for calibrating the analog-to-digital converter of FIG. 12A or FIG. 12B and reporting calibration errors.

Turning now to FIG. 13, there is shown a flowchart of a routine that could be used by the master control 204 of FIG. 12A or the master control 204' of FIG. 12B for calibrating the digital-to-analog converter 200 and the analog-to-digital converter 201 in FIG. 12A or for calibrating the digital-to-analog converter 200' and the analog-to-digital converter 201' in FIG. 12B. In a first step 281, the master control saves the initial values of the polynomial coefficients $a_i$ and $a'_i$ for the digital-to-analog converter and the analog-to-digital converter, respectively. These saved values are used in FIG. 14 for linearity checking, as described below. Then in step 282, the master control performs the procedure described above with respect to FIG. 2 to calibrate the digital-to-analog conversion. Next, in step 283, the residual value $RES_i$ of the amplitude detected by the amplitude detector 56 at the end of adjustment of each of the coefficients $a_0$, $a_2$, $a_3$ is compared to a respective threshold $TH_i$. If the residual for any of the coefficients exceeds the respective threshold, then in step 284 a DAC calibration error is reported to a human operator or to a computer to which the converter system is connected. As indicated by the dotted line path from step 284, execution does not continue until the component causing the error is repaired or replaced in step 280 and the calibration is restarted in step 281. If in step 283 the residual for each of the coefficients does not exceed the respective threshold, then execution branches directly to step 285.

In step 285, the master control performs the procedure described above with respect to FIG. 12A or FIG. 12B to calibrate the analog-to-digital conversion. Next, in step 286, the residual value RES' of the amplitude detected by the amplitude detector (214 in FIG. 12A or 214' in FIG. 12B) at the end of adjustment of each of the coefficients $a'_0$, $a'_2$, $a'_3$ is compared to a respective threshold $TH'_i$. If the residual for any of the coefficients exceeds the respective threshold, then in step 287 an ADC calibration error is reported to a human operator or to a computer to which the converter system is connected, and execution of the calibration routine is finished.

Figure 14:
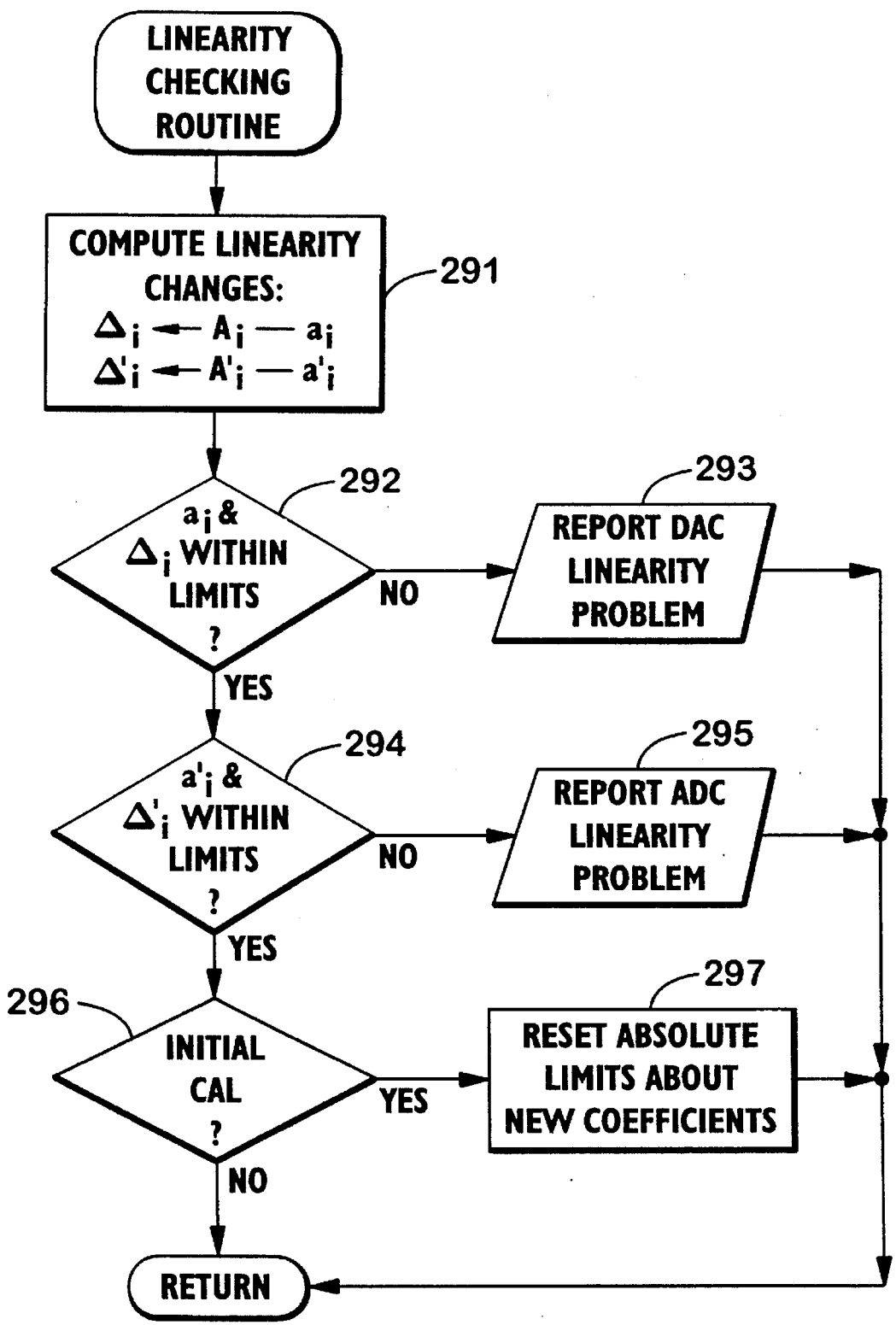
FIG. 14 is a flow chart of a linearity checking routine for detecting problems by monitoring deviations or changes in nonlinearity of the converters or in signal-conditioning circuitry that is digitally compensated in combination with the converters.

Turning now to FIG. 14, there is shown a flowchart of a subroutine for checking the linearity of the DAC and ADC conversion processes in system of FIG. 12A or FIG. 12B, and reporting significant changes in the linearity. In a first step 291 linearity changes $\Delta_i$ and $\Delta'_i$ since the last calibration are computed as the respective differences between the initial polynomial coefficients $A_i$, $A'_i$ and the new polynomial coefficients $a_i$, $a'_i$. In step 292 the DAC polynomial coefficients $a_i$ and changes $\Delta_i$ are compared to respective absolute and "drift" limits. The "drift" limits could depend on the time since the last calibration of the converters. In step 292, for example, the polynomial coefficients are compared directly to the absolute limits, and the magnitudes of the changes $\Delta_i$ are compared to the drift limits. If a limit is exceeded, then in step 293 a DAC linearity problem is reported to the operator or to the computer to which the converter system is connected. Excessive nonlinearity or changes in nonlinearity are particularly sensitive to abnormal conditions and problems with the circuitry being calibrated. For example, for the system shown in FIG. 2, overload of the driver 47 generates pronounced second, third, and higher-order nonlinearities. The driver 47, for example, has thermal overload circuitry which may sharply limit the driver's output current during an overload condition. After step 293, the calibration routine is finished.

If in step 292 the master control finds that the DAC polynomial coefficients $a_i$ and changes $\Delta_i$ are within the limits, then in step 294 the master control checks whether the ADC polynomial coefficients $a'_i$ and changes $\Delta A'_i$ are within certain limits. If not, then in step 295, an ADC linearity problem is reported to the operator or to the computer to which the converter system is connected. After step 295, the calibration routine is finished.

If in step 294 it is found that the ADC polynomial coefficients $a'_i$ and changes $\Delta'_i$ are within certain limits, then in step 296 the master control checks a flag to determine whether the calibration is an initial calibration, for example, during a final test at the factory or during installation of the converter system. If so, then in step 297, the absolute limits are reset about the new coefficients just determined during the initial calibration. For example, during an initial calibration, steps 292 and 293 compare the polynomial coefficients to design limits based on the device-to-device tolerances. After the initial calibration, the system may be periodically re-calibrated to correct for changes in linearity and to diagnose system problems. The subsequent testing may use more stringent absolute limits based on the actual device parameters that are measured during the initial calibration, with the reasonable expectation that the converters should be within these more stringent absolute limits for the expected lifetime of the converters. After step 297, the calibration routine is finished. The calibration routine is also finished in step 296 if the calibration is not an initial calibration.

Figure 15:
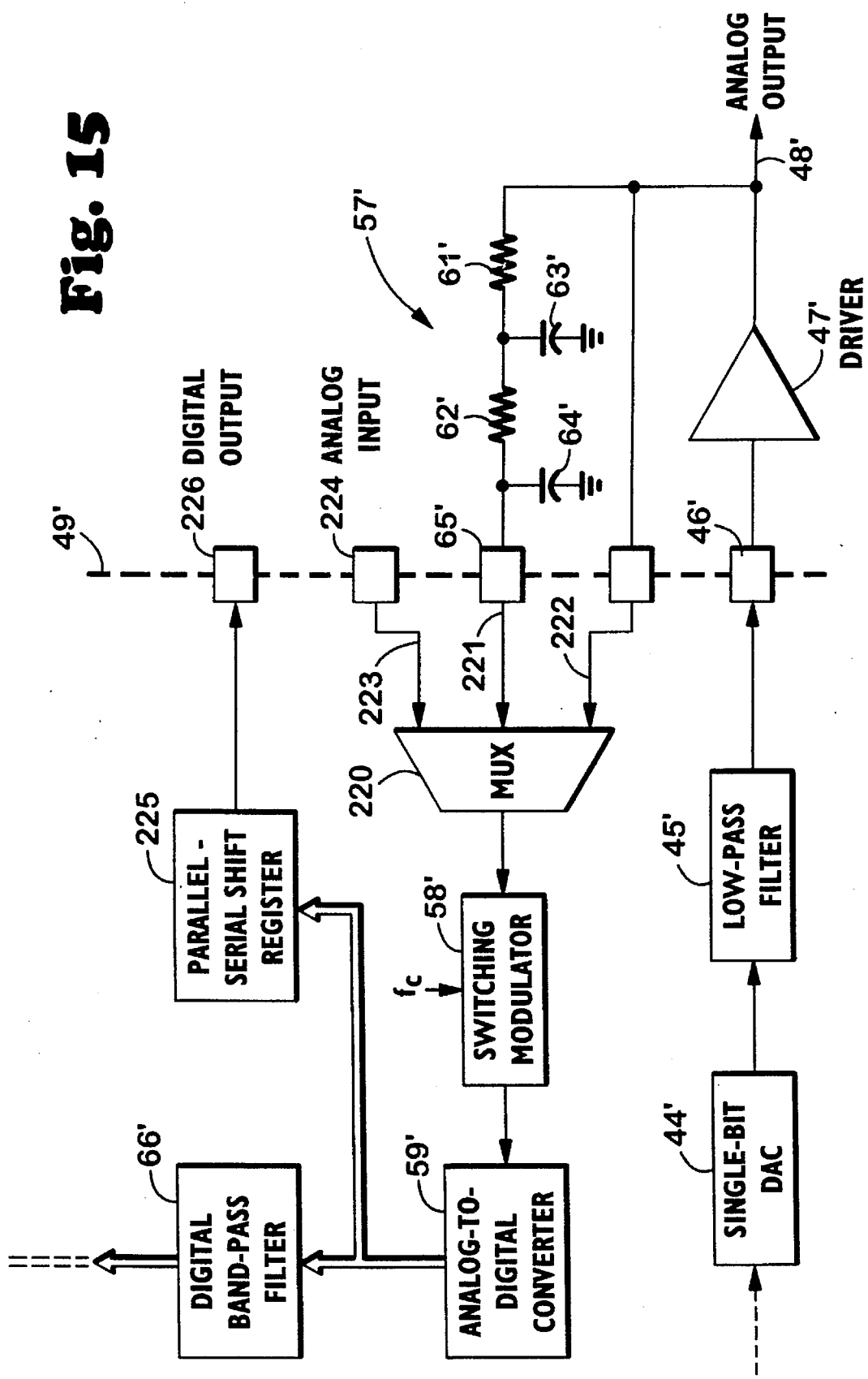
FIG. 15 is a block diagram of modifications that could be made to the block diagram of FIG. 2 in order to use the technique illustrated in FIG. 12A or FIG. 12B for digitally correcting nonlinearity of the analog-to-digital converter used in FIG. 2.

Turning now to FIG. 15, there is shown a block diagram of modifications that could be made to the block diagram of FIG. 2 in order to use the technique illustrated in FIG. 12A or FIG. 12B for digitally correcting nonlinearity of the analog-to-digital converter 59 used in FIG. 2. Components in FIG. 15 that are similar to components in FIG. 2 are designated with similar but primed referenced numerals.

As shown in FIG. 15, a three input multiplexer 220 has been inserted between the terminal 65' and the switching modulator 58'. During digital-to-analog converter calibration as described above with reference to FIG. 2, the multiplexer 220 selects the input 221 so that the switching modulator 58' receives a signal from the terminal 65'. During calibration of the analog-to-digital converter 59' as described above with reference to FIG. 12A or FIG. 12B, the multiplexer 220 selects the input 222 so that the switching modulator 58' is connected to the analog output 48'. The analog-to-digital converter 59' for example, includes components similar to the components 201, 210, 211, 212, 213, 214, 215, and 216 shown in FIG. 12A. After the analog-to-digital converter 59' has been calibrated, it can be used to recalibrate the digital-to-analog converter, as will be further described below with reference to FIG. 16.

The multiplexer 220 has a third input 223 so that the switching modulator 58' may be connected to an analog input 224. After the analog-to-digital converter 59' has been calibrated, it can be used to convert the analog signal on the analog input 224. The converted signal is received in a parallel-serial shift register 225 and transmitted to a digital output terminal 226.

Figure 16:
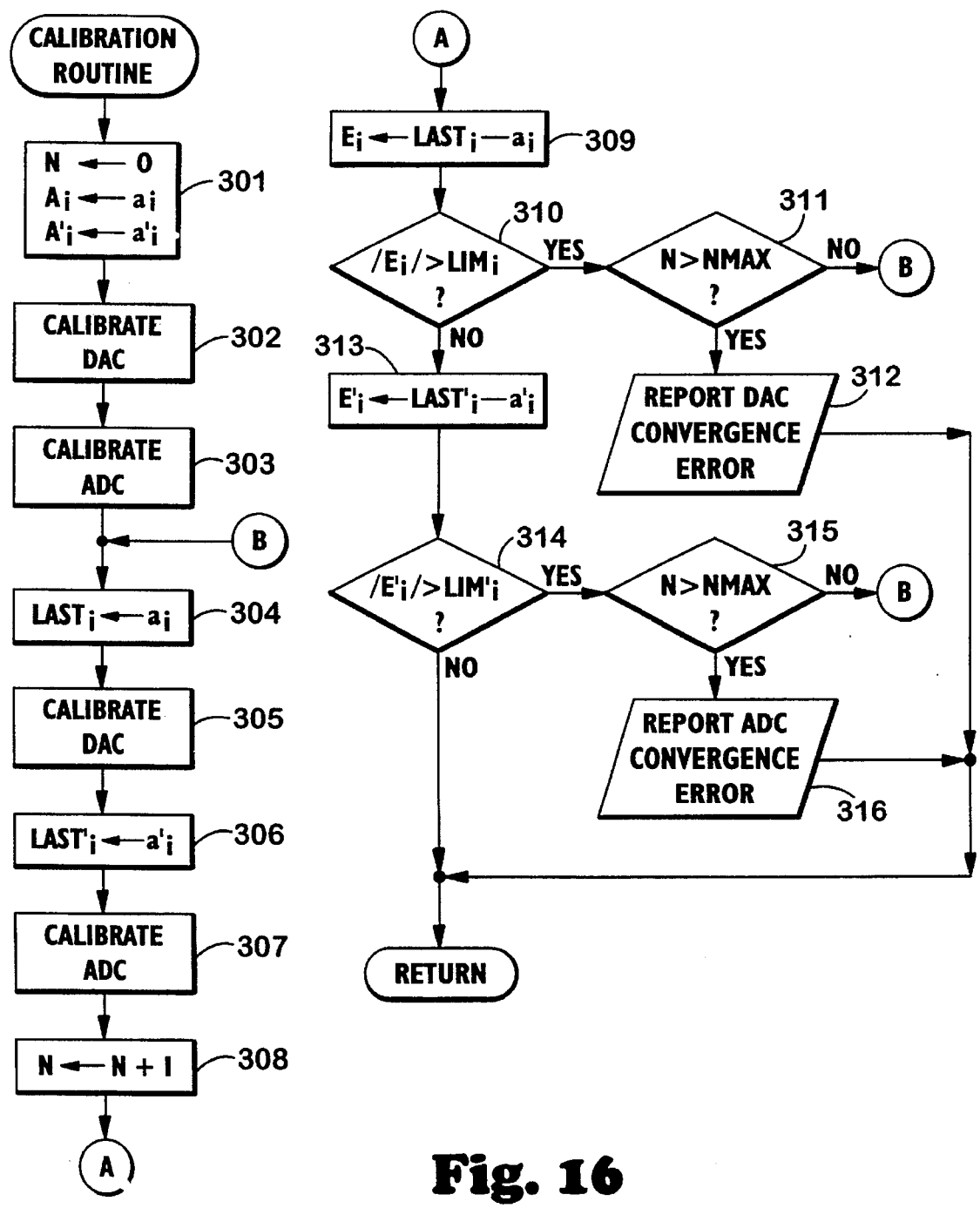
FIG. 16 is a flow chart of a calibration routine for alternately and iteratively calibrating an analog-to-digital converter and a digital-to-analog converter in a system such as the system of FIG. 2 as modified as shown in FIG. 15 to digitally correct nonlinearity.

Turning now to FIG. 16, there is shown a flow chart of an iterative calibration routine performed by a master control in a converter system such as the system of FIG. 2 modified as shown in FIG. 15. In a first step 301, the master control clears an iteration counter N, and saves the initial values of the polynomial coefficients $a_i$ and $a'_i$. These saved values could be used later by the routine of FIG. 14 for diagnosing and reporting linearity problems. Then in step 302, the master control performs the procedure described above with respect to FIG. 2 to calibrate the digital-to-analog conversion. In step 303, the master control performs a procedure as described above with respect to FIG. 12A or FIG. 12B to calibrate the analog-to-digital conversion. In step 304, the master control saves the values of the polynomial coefficients $a'_i$ in a storage array $LAST_i$. In step 305, the master control re-calibrates the digital-to-analog conversion using the procedure described above with respect to FIG. 2. In step 306, the master control saves the values of the polynomial coefficients $a'_i$ in a storage array $LAST'_i$. Then, in step 307, the master control again calibrates the analog-to-digital conversion using the procedure described above with respect to FIG. 12A or FIG. 12B. In step 308, the master control increments the iteration counter N by 1.

To test for convergence, in step 309 the master control computes the difference $E_i$ between the last value and the current value of each of the polynomial coefficients $a_i$ for i=0, 2 and 3. In step 310, the magnitude of the difference $E_i$ is compared to a limit $LIM_i$ for i=0, 2, and 3, and if the magnitude of any difference exceeds its respective limit, then in step 311 the iteration counter N is compared to a maximum value NMAX. If the maximum value is not exceeded, then the procedure loops back to step 304 to perform another iteration. Otherwise, in step 312 a DAC convergence error is reported, for example, to a human operator of the system, or to a computer which is connected to the system. After step 312, the calibration routine is finished.

In step 310, if the magnitude of each difference $E_i$ is less than its respective limit for each of the polynomial coefficients, then in step 313 the difference $E'_i$ between the old value and the new value for each of the polynomial coefficients $a'_i$ is computed to test for convergence of the ADC calibration In step 314, if the magnitude of any difference $E'_i$ is greater than its respective limit $LIM'_i$, then in step 315 the iteration counter N is compared to the maximum NMAX. If the maximum is not exceeded, then the procedure loops back to step 304. Otherwise, in step 316, an ADC convergence error is reported to a human operator or to a computer to which the converter system is connected. After step 316, the calibration routine is finished. If in step 314 the magnitude of each difference $E'_i$ is not greater than its respective limit, then the calibration routine is also finished.

Figure 17:
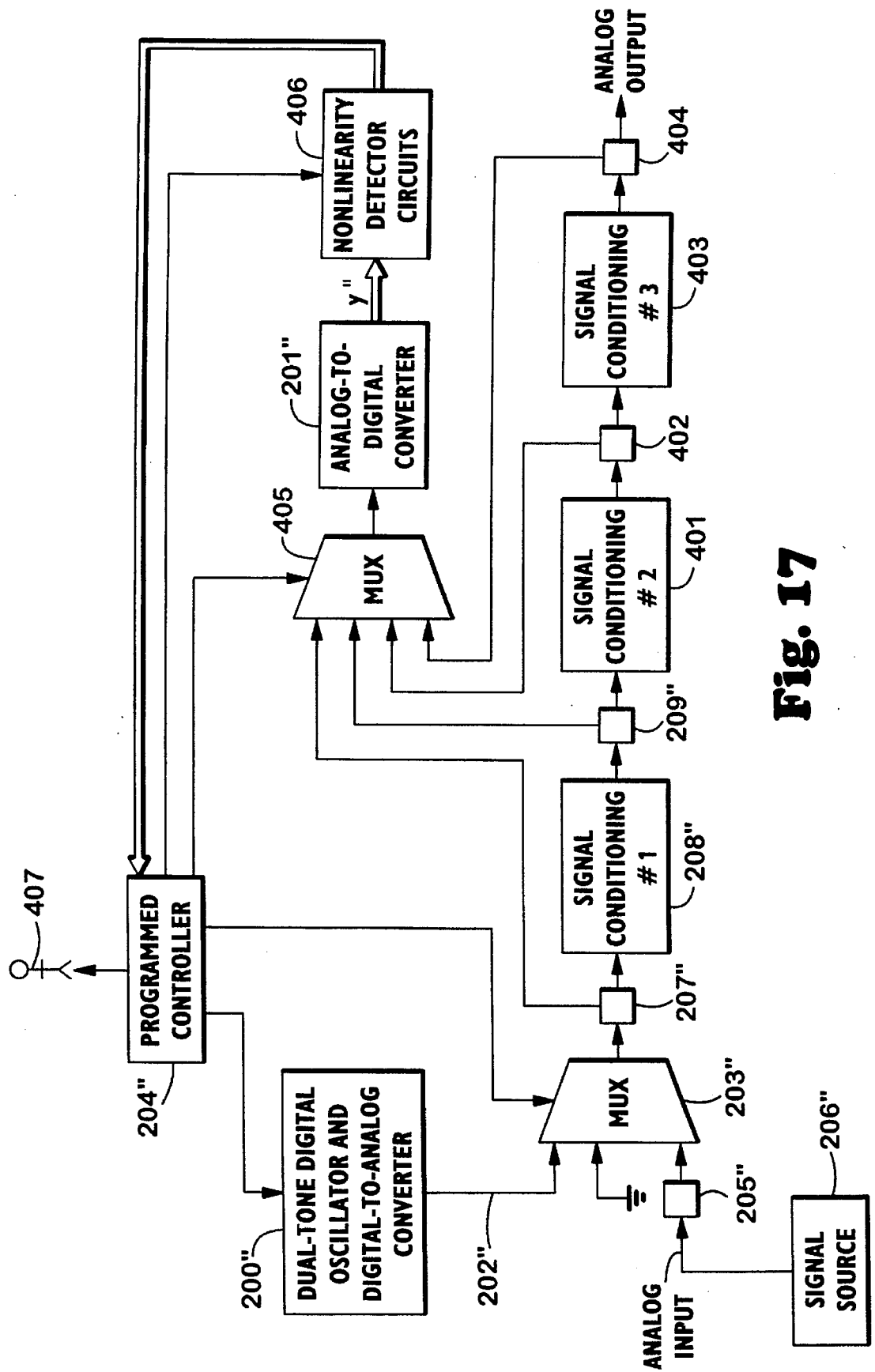
FIG. 17 is a block diagram showing a modification of the system of FIG. 12A or FIG. 12B for diagnosing a linearity problem in a particular one of a number of cascaded signal conditioning circuits.

Turning now to FIG. 17, there is shown a modification of the circuit of FIG. 12A or FIG. 12B for diagnosing a linearity problem in a particular one of a number of cascaded signal conditioning circuits. Components in FIG. 17 that are similar to components in FIG. 12A and FIG. 12B are designated with similar but double primed (") reference numerals. The signal conditioning circuits include a first signal conditioning circuit 208", a second signal conditioning circuit 401, and a third signal conditioning circuit 403.

The circuit in FIG. 17 includes an additional multiplexer 405 permitting an analog-to-digital converter 201" to convert an analog signal selected from either a terminal 207" that is the input to the first signal conditioning circuit 208" a terminal 209" that is the output of the first signal conditioning circuit 401, a terminal 402 that is the output of the second signal conditioning circuit 403, or a terminal 404 that is the output of the third signal conditioning circuit 403 and provides the analog output of the cascaded signal conditioning circuits.

The digital output y" of the analog-to-digital converter 201" is received by nonlinearity detector circuits 406. The nonlinearity detector circuits 406 are digital circuits for measuring the nonlinearity of a transfer function from a dual-tone digital oscillator and digital-to-analog converter 200" to the output y" of the analog-to-analog digital converter 201". In other words, the nonlinearity detector circuits 406 may include the components 210, 212, 213, 214, 215, 216, and 211 of FIG. 12A. Alternatively, the nonlinearity detector circuits 406 may include the components 210', 218, 213', 214', 216', and 211' of FIG. 12B. The polynomial coefficients determined by the nonlinearity detector circuits 406 are provided to a programmed controller 204" which also provides master control logic analogous to the master control logic 204 of FIG. 12A or the master control logic 204' of FIG. 12B.

Figure 18:
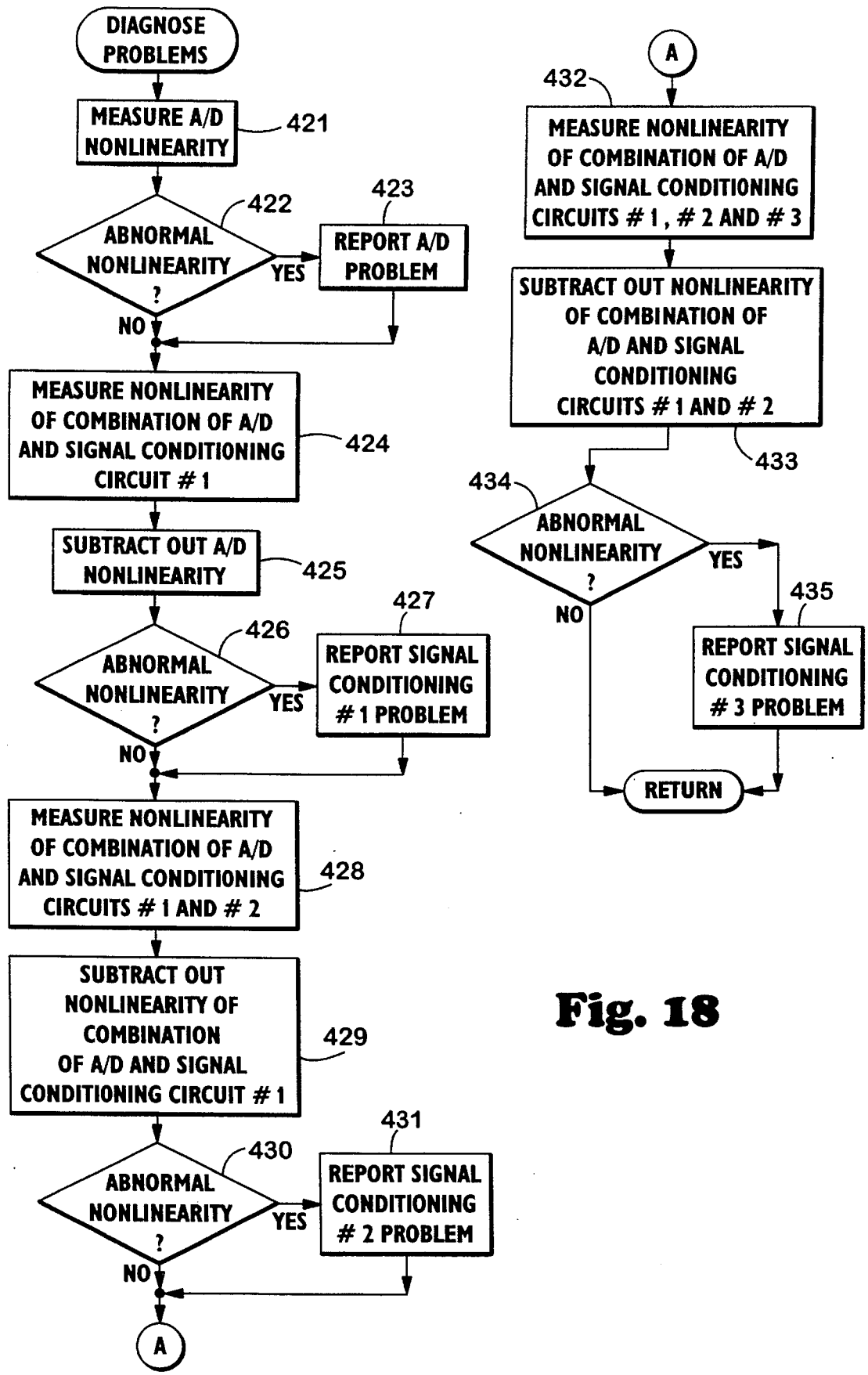
FIG. 18 is a flowchart of a procedure executed by a programmed controller for diagnosing a linearity problem in the circuit of FIG. 17.

Turning now to FIG. 18, there is shown a flowchart of a procedure executed by the programmed controller 204" for diagnosing a linearity problem in the circuit of FIG. 17. The flowchart in FIG. 18 represents a control program stored in memory of the programmed controller.

In the first step 421 of FIG. 18, the programmed controller 204" operates the circuitry in FIG. 17 to measure the nonlinearity of the analog-to-digital converter 201". In this case, the programmed controller 204" operates the dual-tone digital oscillator and digital-to-analog converter 200" to generate a dual-tone test signal 202". The programmed controller 204" enables the multiplexer 203" to select either the calibration signal 202" or ground for calibrating the analog-to-digital converter 201" by following the procedure described above with reference to FIG. 12A or FIG. 12B. This calibration procedure results in a determination of the nonlinearity of the analog-to-digital converter 201". In this case the programmed controller 264" also operates the multiplexer 405 so that the analog-to-digital converter 201" converts the analog signal selected by the multiplexer 203" and appearing on the terminal 207".

Next, in step 422, the programmed controller 204" checks the polynomial coefficients from the nonlinearity detector circuits 406 to determine whether the calibrated analog-to-digital converter 201" has abnormal linearity. If so, then execution branches to step 423 where an analog-to-digital converter problem is reported to a human operator 407 shown in FIG. 17. After step 423 in FIG. 18, or when step 422 does not find abnormal nonlinearity, then in step 424 the programmed controller operates the multiplexer 405 in FIG. 17 to select the analog signal from the output terminal 209" of the first signal conditioning circuit 208". The nonlinearity detector circuits 406 are operated to calibrate the combination of the first signal conditioning circuit 208" and the analog-to-digital converter 201" so that the resulting polynomial coefficients comprise a measurement of the nonlinearity of the combination of the analog-to-digital converter 201" and the first signal conditioning circuit 208".

Next, step 425 of FIG. 18, the programmed controller subtracts the analog-to-digital converter nonlinearity measured in step 421 from the nonlinearity of the combination of the analog-to-digital converter and the first signal conditioning circuit 208" measured in step 424. Therefore, the difference represents the nonlinearity of the first signal conditioning circuit 208". In step 425, for example, under the assumption that the nonlinearity is relatively small, the second-order coefficient measured in step 421 is subtracted from the second order coefficient measured in step 424 to determine a second-order coefficient representing the nonlinearity of the first signal conditioning circuit 208" and the third-order coefficient measured in step 421 is subtracted from the third-order coefficient measured in step 424 to determine a third-order coefficient representing the nonlinearity of the first signal conditioning circuit 208".

Next in step 426 the programmed controller determines whether the computed nonlinearity of the first signal conditioning circuit 208" is abnormal. For example, each of the second order and third-order coefficients for the first signal conditioning circuit 208" is compared to a respective threshold value to determine whether the first signal conditioning circuit 208" has abnormal nonlinearity. If so, then in step 427 the programmed controller 204" reports to the operator 407 of FIG. 17 that the first signal conditioning circuit 208" has a linearity problem.

After step 427, or when step 426 fails to find abnormal nonlinearity, execution continues in step 428. In step 428, the programmed controller 204" operates the multiplexer 405 to select the output of the second signal conditioning circuit 401 on the terminal 402. Then the programmed controller 204" operates the nonlinearity detector circuits 406 to calibrate the combination of the analog-to-digital converter 201" the first signal conditioning circuit 208", and the second signal conditioning circuit 401. When the calibration is completed, the polynomial coefficients are a measurement of the nonlinearity of the combination of the analog-to-digital converter 201" and the first and second signal conditioning circuits 208" and 401. Next, in step 429, the programmed controller 204" subtracts the measurement in step 424 from the measurement in step 428. This difference represents the nonlinearity of the second signal conditioning circuit 401.

In step 430 the programmed controller determines whether the nonlinearity of the second signal conditioning circuit 401 is abnormal. If so, then in step 431 the programmed controller 204" reports to the operator 407 that the second signal conditioning circuit has a linearity problem.

After step 430, or when step 431 fails to find abnormal nonlinearity, then in step 432 the programmed controller operates the multiplexer 405 to select the analog output from the third signal conditioning circuit 403 on the terminal 404. The programmed controller also operates the nonlinearity detector circuits 406 to calibrate the combination of the analog-to-digital converter 201" the first signal conditioning circuit 208" the second signal conditioning circuit 401, and the third signal conditioning circuit 403. After calibration, the polynomial coefficients from the nonlinearity detector circuits 406 are a measurement of the nonlinearity of the combination of the analog-to-digital converter 201" with the first, second, and third signal conditioning circuits. Next, in step 433 of FIG. 18, the programmed controller subtracts the measurement of step 428 from the measurement in step 431. This difference represents the nonlinearity of the third signal conditioning circuit 403.

In step 434, the programmed controller determines whether the nonlinearity of the third signal conditioning circuit 403 is abnormal. If so, then in step 435, the programmed controller 204" reports to the operator that the third signal conditioning circuit 403 has a linearity problem. After step 435, or when step 434 fails to find abnormal nonlinearity, the procedure in FIG. 18 is finished.

In cases where the signal conditioning circuits are linear absent a linearity problem, then the procedure of FIG. 18 can be simplified by terminating the procedure immediately after any of steps 423, 427, or 431 are reached. Therefore, if any of steps 425, 429, or 433 are reached, the nonlinearity that would be subtracted out is virtually zero, so that the subtraction operations of steps 425, 429, and 433 can be eliminated.

In view of the above, there has been described a method of correcting nonlinearity of a digital-to-analog converter without using a linearity reference. The method is not limited to a particular kind of converter technology, although it is easily used in conjunction with delta-sigma converters and single-chip converter systems. The method can be used to calibrate the linearity of customer-supplied signal conditioning circuitry external to an integrated circuit including a digital-to-analog converter and circuitry for calibrating the digital-to-analog converter. The method can also be used for obtaining a specified non-linear transfer function, by first correcting the nonlinearity of the digital-to-analog converter system, and then adjusting the compensation coefficients to obtain the specified non-linear transfer function.

What is claimed is:

1. A method of operating a digital-to-analog converter, said method comprising the steps of:
   a) generating a digital calibration signal having at least one frequency component;
   b) operating said digital-to-analog converter in a calibration mode to convert said digital calibration signal to produce an analog signal;
   c) detecting, in said analog signal, a frequency component generated from said digital calibration signal by nonlinearity, to produce a compensation coefficient; and
   d) operating said digital-to-analog converter in a conversion mode in which a digital input signal is digitally compensated by said compensation coefficient to produce a distorted digital signal, said compensation coefficient specifying a degree of nonlinear distortion of said digital input signal produced in said distorted digital signal, and in which the distorted digital signal is converted by said digital-to-analog converter to produce an analog signal having reduced nonlinear distortion.

2. A method of operating a digital-to-analog converter, said method comprising the steps of:
   a) generating a digital calibration signal having at least one frequency component;
   b) operating said digital-to-analog converter in a calibration mode to convert said digital calibration signal to produce an analog signal;
   c) detecting, in said analog signal, a frequency component generated from said digital calibration signal by nonlinearity, to produce a compensation coefficient; and
   d) operating said digital-to-analog converter in a conversion mode in which a digital input signal is digitally compensated by said compensation coefficient to produce a distorted digital signal, and in which the distorted digital signal is converted by said digital-to-analog converter to produce an analog signal having reduced distortion,
   wherein said step (a) of generating includes generating first and second frequencies in said digital calibration signal, and wherein said frequency component generated from said digital calibration signal by nonlinearity is an intermodulation component produced by intermodulation between said first frequency and said second frequency.

3. The method as claimed in claim 2, wherein said frequency component generated from said digital calibration signal by nonlinearity has a frequency that is a difference between said first frequency and said second frequency.

4. The method as claimed in claim 2, which further includes passing said analog signal through a signal conditioning circuit before said step of detecting, in said analog signal, a frequency component generated from said digital calibration signal by nonlinearity, so that said compensation coefficient compensates for nonlinearity in a transfer function representing a combination of said digital-to-analog converter and said signal conditioning circuit.

5. A method of calibrating a digital-to-analog converter, said method comprising the steps of:
   a) generating a digital calibration signal having at least one frequency component;
   b) compensating said digital calibration signal in accordance with at least one compensation coefficient to produce a distorted version of said digital calibration signal, said compensation coefficient specifying a degree of nonlinear distortion of said to digital calibration signal produced in said distorted version of said digital calibration signal;
   c) operating said digital-to-analog converter to convert said distorted version of said digital calibration signal to produce an analog signal;
   d) detecting, in said analog signal, a frequency component absent from said digital calibration signal; and
   e) adjusting said compensation coefficient in response to the detected frequency component absent from said digital calibration signal so that the detected frequency component is reduced and said analog digital has reduced nonlinear distortion.

6. A method of calibrating a digital-to-analog converter, said method comprising the steps of:
   a) generating a digital calibration signal having at least one frequency component;

b) compensating said digital calibration signal in accordance with at least one compensation coefficient to produce a distorted version of said digital calibration signal;

c) operating said digital-to-analog converter to convert said distorted version of said digital calibration signal to produce an analog signal;.

d) detecting, in said analog signal, a frequency component absent from said digital calibration signal; and e) adjusting said compensation coefficient in response to the detected frequency component absent from said digital calibration signal so that the detected frequency component is reduced, wherein said step (a) of generating includes generating first and second frequencies in said digital calibration signal, and wherein said frequency component absent from said digital calibration signal is an intermodulation component produced by intermodulation between said first frequency and said second frequency.

7. The method as claimed in claim 6, wherein said frequency component absent from said digital calibration signal has a frequency that is a difference between said first frequency and said second frequency.

8. The method as claimed in claim 6, wherein said steps b) through e) are repeated until said detected frequency component is substantially eliminated.

9. The method as claimed in claim 6, wherein said steps b) through e) are repeated a predetermined number of times.

10. The method as claimed in claim 6, wherein said steps b) through e) are repeated until said detected frequency component has a magnitude below a certain threshold level.

11. A method of calibrating a digital-to-analog converter, said method comprising the steps of:

a) generating a digital calibration signal having at least one frequency component;

b) compensating said digital calibration signal in accordance with at least one compensation coefficient to produce a distorted version of said digital calibration signal;

c) operating said digital-to-analog converter to convert said distorted version of said digital calibration signal to produce an analog signal;

d) detecting, in said analog signal, a frequency component absent from said digital calibration signal; and e) adjusting said compensation coefficient in response to the detected frequency component absent from said digital calibration signal so that the detected frequency component is reduced, wherein after step e), the compensation coefficient is adjusted by a specified amount and used to pre-distort a digital input signal, and the pre-distorted digital input signal is converted by said digital-to-analog converter to obtain a corresponding analog signal, so that the conversion of said digital input signal to said corresponding analog signal has a specified non-linear transfer function.

12. The method as claimed in claim 11, wherein said step b) includes computing a polynomial of said digital calibration signal to produce said distorted version of said digital calibration signal, said polynomial including a quadratic term and a cubic term.

13. The method as claimed in claim 12, wherein said steps b) through e) are repeated a number of times to generate a coefficient for one of said terms, and then said digital calibration signal is changed by changing a frequency component of said digital calibration signal, and said steps b) through e) are again repeated a number of times to generate a coefficient for the other of said terms.

14. A method of calibrating a digital-to-analog converter, said method comprising the steps of:

a) generating a digital calibration signal having a first frequency component and a second frequency component;

b) operating said digital-to-analog converter in a calibration mode to convert said digital calibration signal to produce an analog signal;

c) low-pass filtering said analog signal to produce a filtered analog signal;

d) detecting, in said filtered analog signal, an intermodulation component, to produce a compensation coefficient, said intermodulation component being at a frequency that is a difference between said first frequency and said second frequency, said intermodulation component being generated from said digital calibration signal by nonlinearity, and said first frequency component and said second frequency component having been reduced in amplitude relative to said intermodulation component by said low-pass filtering; and d) operating said digital-to-analog converter in a conversion mode in which a digital input signal is digitally compensated by said compensation coefficient to produce a distorted digital signal, and in which the distorted digital signal is converted by said digital-to-analog converter to produce an analog signal having reduced distortion.

15. The method as claimed in claim 14, which further includes passing said analog signal through a signal conditioning circuit before said step of low-pass filtering, so that said compensation coefficient compensates for nonlinearity in a transfer function representing a combination of said digital-to-analog converter and said signal conditioning circuit.

16. The method as claimed in claim 14, wherein said step d) of detecting an intermodulation component includes operating an analog-to-digital converter to digitize said filtered analog signal to produce a digitized signal, and digitally processing said digitized signal to detect said intermodulation component.

17. The method as claimed in claim 16, wherein said processing of said digitized signal includes passing said digitized signal through a digital band-pass filter to select said intermodulation component.

18. The method as claimed in claim 17, wherein said processing of said digitized signal includes detecting absolute value of said intermodulation component passing through said digital band-pass filter.

19. The method as claimed in claim 18, which includes producing said compensation coefficient by iteratively adjusting said compensation coefficient by either increasing or decreasing said compensation coefficient by an amount proportional to said absolute value, and determining whether the compensation coefficient is to be increased or decreased depending on whether the compensation coefficient was increased or decreased during a last iteration, and by checking whether a last change to the compensation coefficient caused the absolute value to increase or decrease.

20. The method as claimed in claim 16, wherein said processing of said digitized signal includes synchronously detecting said intermodulation component.

21. A method of operating a digital-to-analog converter, said method comprising the steps:

(a) generating a first digital calibration signal having two frequency components;

(b) operating said digital-to-analog converter in a calibration mode to convert said first digital calibration signal to produce a first analog signal;

(c) detecting, in said first analog signal, a first intermodulation component generated from said two frequency components in said first digital calibration signal, to produce a first compensation coefficient;

(d) generating a second digital calibration signal having two frequency components;

(e) operating said digital-to-analog converter in a calibration mode to convert said second digital calibration signal to produce a second analog signal;

(f) detecting, in said second analog signal, a second intermodulation component generated from said two frequency components in said second digital calibration signal, to produce a second compensation coefficient; and (g) operating said digital-to-analog converter in a conversion mode in which a digital input signal is digitally compensated by said compensation coefficients to produce a distorted digital signal, and in which the distorted digital signal is converted by said digital-to-analog converter to produce an analog signal having reduced distortion.

22. The method as claimed in claim 21, wherein said digital input signal is digitally compensated by computing a polynomial of said digital input signal, one of said compensation coefficients being a coefficient of a quadratic term in said polynomial, and another of said compensation coefficients being a coefficient of a cubic term in said polynomial.

23. The method as claimed in claim 21, wherein said first intermodulation component has a first frequency and said second intermodulation component has a second frequency that is about the same as said first frequency, and said step c) includes filtering said first analog signal to select said first intermodulation component and suppress said two frequency components of said first calibration signal, and wherein said step (f) includes filtering said second analog signal to select said second intermodulation component and suppress said two frequency components of said second calibration signal.

24. The method as claimed in claim 21, which further comprises the step of adjusting DC offset of said digital-to-analog converter so that said digital-to-analog converter provides a substantially zero analog output for a substantially zero digital input, wherein said step of adjusting DC offset of said digital-to-analog converter is performed before said steps (b) to (g).

25. The method as claimed in claim 21, wherein said first intermodulation component has a first frequency and said second intermodulation component has a second frequency that is about the same as said first frequency, and wherein said method further comprises the step of adjusting DC offset of said digital-to-analog converter by applying a substantially zero digital input to said digital-to-analog converted to obtain a substantially constant analog output of said digital-to-analog converter, modulating said substantially constant analog output at a modulation frequency that is about the same as said first frequency and said second frequency to produce a modulated signal at said modulation frequency, and adjusting offset of said digital-to-analog converter to substantially eliminate said modulated signal.

26. The method as claimed in claim 25, wherein said offset of said digital-to-analog converter is adjusted digitally by adjusting an offset coefficient which offsets said digital input of said digital-to-analog converter prior to digital-to-analog conversion by said digital-to-analog converter.

27. The method as claimed in claim 25, which includes passing said substantially constant analog signal through an analog switching modulator which chops said substantially constant analog signal at said modulating frequency to produce said modulated signal.

28. The method as claimed in claim 27, which further includes digitizing said modulated signal and digitally detecting said modulated signal for adjusting offset of said digital-to-analog converter to substantially eliminate said modulated signal.

29. A method of using an analog-to-digital converter for calibrating a digital-to-analog converter to reduce offset of said digital-to-analog converter, said method comprising the steps of:

a) operating said digital-to-analog converter to convert a digital input value of substantially zero to an analog signal;

b) chopping said analog signal at a chopping frequency to produce a modulated signal;

c) operating said analog-to-digital converter to digitize said modulated signal to produce a digitized signal;

d) digitally detecting a component at said chopping frequency in said digitized signal;

e) adjusting said digital input value to minimize the detected component at said chopping frequency in said digitized signal and produce a digital offset value; and f) using said digital offset value to offset a digital signal prior to conversion of said digital signal by said digital-to-analog converter.

30. The method as claimed in claim 29, wherein said step of digitally detecting a component at said chopping frequency in said digitized signal includes passing said digitized signal through a digital band-pass filter to select said component at said chopping frequency, and digitally detecting amplitude of said component at said chopping frequency.

31. A digital-to-analog converter system having an analog output, said system comprising, in combination:

a digital oscillator for generating a digital calibration signal having at least one frequency component;

compensation coefficient storage for storing a compensation coefficient;

a digital compensation unit connected to said digital oscillator for receiving the digital calibration signal and connected to said compensation coefficient storage for digitally compensating the digital calibration signal with said compensation coefficient to produce a compensated digital signal, said compensation coefficient specifying a degree of nonlinear distortion of said digital calibration signal produced in said compensated digital signal;

a digital-to-analog converter connected to said digital compensation unit for converting said compensated digital signal to an analog signal, said analog output being connected to said digital-to-analog converter to receive said analog signal;

a frequency-selective amplitude detector connected to said analog output for detecting a distortion component in said analog signal generated by nonlinearity from said calibration signal; and a compensation coefficient computation unit connected to said frequency-selective amplitude detector and said compensation coefficient storage for adjusting said compensation coefficient to reduce the distortion component detected by said frequency-selective amplitude detector and to reduce nonlinear distortion in said analog signal.

32. A digital-to-analog converter system having an analog output, said system comprising, in combination:

a digital oscillator for generating a digital calibration signal having at least one frequency component;

compensation coefficient storage for storing a compensation coefficient;

a digital compensation unit connected to said digital oscillator for receiving the digital calibration signal and connected to said compensation coefficient storage for digitally compensating the digital calibration signal with said compensation coefficient to produce a compensated digital signal;

a digital-to-analog converter connected to said digital compensation unit for converting said compensated digital signal to an analog signal, said analog output being connected to said digital-to-analog converter to receive said analog signal;

a frequency-selective amplitude detector connected to said analog output for detecting a distortion component in said analog signal generated by nonlinearity from said calibration signal; and a compensation coefficient computation unit connected to said frequency-selective amplitude detector and said compensation coefficient storage for adjusting said compensation coefficient to reduce the distortion component detected by said frequency-selective amplitude detector, wherein the digital oscillator is a dual-tone digital oscillator for generating two frequencies, and wherein the frequency-selective amplitude detector has a frequency response selecting an intermodulation component of said two frequencies.

33. The system as claimed in claim 32, wherein said digital-to-analog converter includes:

a digital delta-sigma modulator connected to said digital compensation unit for receiving said compensated digital signal and generating a single-bit stream;

a single-bit digital-to-analog converter connected to said digital delta-sigma modulator for converting said single-bit stream to a signal having two voltage levels; and a low-pass filter connected to said single-bit digital-to-analog converter for filtering said signal having two voltage levels to produce said analog signal.

34. The system as claimed in claim 32, further including signal conditioning circuitry connected to said digital-to-analog converter and to said analog output for conditioning said analog signal as said analog signal passes from said digital-to-analog converter to said analog output.

35. The system as claimed in claim 34, wherein said signal conditioning circuitry includes a driver circuit for providing a relatively low impedance at said analog output.

36. The system as claimed in claim 32, wherein said frequency-selective amplitude detector includes a continuous-time low-pass filter connected to said analog output for low-pass filtering said analog signal.

37. The system as claimed in claim 36, wherein said continuous-time low-pass filter includes at least one section having a series resistor and a shunt capacitor.

38. A digital-to-analog converter system having an analog output, said system comprising, in combination:

a digital oscillator for generating a digital calibration signal having at least one frequency component;

compensation coefficient storage for storing a compensation coefficient;

a digital compensation unit connected to said digital oscillator for receiving the digital calibration signal and connected to said compensation coefficient storage for digitally compensating the digital calibration signal with said compensation coefficient to produce a compensated digital signal;

a digital-to-analog converter connected to said digital compensation unit for converting said compensated digital signal to an analog signal, said analog output being connected to said digital-to-analog converter to receive said analog signal;

a frequency-selective amplitude detector connected to said analog output for detecting a distortion component in said analog signal generated by nonlinearity from said calibration signal;

a compensation coefficient computation unit connected to said frequency-selective amplitude detector and said compensation coefficient storage for adjusting said compensation coefficient to reduce the distortion component detected by said frequency-selective amplitude detector; and a digital multiplexer having a digital input for receiving a digital input signal and being connected to said digital oscillator and to said digital compensation unit for selecting either said digital calibration signal or said digital input signal and passing the selected signal to said digital compensation unit for digital compensation by said digital compensation unit prior to digital-to-analog conversion by said digital-to-analog converter.

39. A digital-to-analog converter system having an analog output, said system comprising, in combination:

a digital oscillator for generating a digital calibration signal having at least one frequency component;

compensation coefficient storage for storing a compensation coefficient;

a digital compensation unit connected to said digital oscillator for receiving the digital calibration signal and connected to said compensation coefficient storage for digitally compensating the digital calibration signal with said compensation coefficient to produce a compensated digital signal;

a digital-to-analog converter connected to said digital compensation unit for converting said compensated digital signal to an analog signal, said analog output being connected to said digital-to-analog converter to receive said analog signal;

a frequency-selective amplitude detector connected to said analog output for detecting a distortion component in said analog signal generated by nonlinearity from said calibration signal; and a compensation coefficient computation unit connected to said frequency-selective amplitude detector and said compensation coefficient storage for adjusting said compensation coefficient to reduce the distortion component detected by said frequency-selective amplitude detector, wherein said digital compensation unit is a polynomial generator for computing a polynomial having at least a second-order term and a third-order term using a second-order coefficient and a third-order coefficient obtained from said compensation coefficient storage.

40. A digital-to-analog converter system having an analog output, said system comprising, in combination:
- a digital oscillator for generating a digital calibration signal having at least one frequency component;
- compensation coefficient storage for storing a compensation coefficient;
- a digital compensation unit connected to said digital oscillator for receiving the digital calibration signal and connected to said compensation coefficient storage for digitally compensating the digital calibration signal with said compensation coefficient to produce a compensated digital signal;
- a digital-to-analog converter connected to said digital compensation unit for converting said compensated digital signal to an analog signal, said analog output being connected to said digital-to-analog converter to receive said analog signal;
- a frequency-selective amplitude detector connected to said analog output for detecting a distortion component in said analog signal generated by nonlinearity from said calibration signal; and
- a compensation coefficient computation unit connected to said frequency-selective amplitude detector and said compensation coefficient storage for adjusting said compensation coefficient to reduce the distortion component detected by said frequency-selective amplitude detector,
- wherein said frequency-selective amplitude detector includes an analog-to-digital converter connected to said analog output for digitizing said analog signal to produce a digitized signal, a digital band-pass filter connected to said analog-to-digital converter for band-pass filtering said digitized signal to select said distortion component and produce a band-pass filtered signal; and an amplitude detector connected to said band-pass filter for detecting amplitude of said distortion component in said band-pass filtered signal.

41. The system as claimed in claim 40, wherein said amplitude detector is a synchronous detector.

42. The system as claimed in claim 40, wherein said amplitude detector is an asynchronous detector detecting a magnitude of said distortion component, and wherein said compensation coefficient computation unit includes means for iteratively adjusting said compensation coefficient and means for determining whether the compensation coefficient is to be increased or decreased depending on whether the compensation coefficient was increased or decreased during a last iteration, and by checking whether a last change to the compensation coefficient caused said magnitude to increase or decrease.

43. The system as claimed in claim 40, further comprising a modulator connected to said band-pass filter for modulating any dc component in said analog signal at a frequency passed by said band-pass filter to generate a modulated signal passed to said band-pass filter so that said amplitude detector detects dc offset of said digital-to-analog converter during a dc offset correction mode when said digital-to-analog converter converts a digital value of substantially zero.

44. The system as claimed in claim 43, wherein said modulator is an analog switching modulator connected between said analog output and an analog input of said analog-to-digital converter.

45. The system as claimed in claim 40, wherein said analog-to-digital converter has a substantially lower dynamic range than said digital-to-analog converter.

46. The system as claimed in claim 40, wherein said analog-to-digital converter has a substantially lower sampling rate than said digital-to-analog converter.

47. A digital-to-analog converter system having an analog output, said system comprising, in combination:
- a dual-tone digital oscillator for generating a series of digital calibration signals each having two frequency components;
- polynomial coefficient storage for storing polynomial coefficients, including at least a second-order coefficient and a third-order coefficient;
- a polynomial generator connected to said digital oscillator for receiving the digital calibration signals and connected to said polynomial coefficient storage for computing polynomials of said digital calibration signals to produce compensated digital signals;
- a digital-to-analog converter connected to said polynomial generator for converting said compensated digital signals to analog signals, said analog output being connected to said digital-to-analog converter to receive said analog signals;
- a continuous-time low-pass filter connected to said analog output for low-pass filtering said analog signals to provide low-pass filtered signals in which said two frequency components for each of said calibration signals are substantially reduced in amplitude in comparison to intermodulation components generated by nonlinearity from said calibration signals;
- an analog-to-digital converter for digitizing said low-pass filtered signals to produce digitized signals;
- digital processing circuits connected to said analog-to-digital converter and to said polynomial coefficient storage for detecting said intermodulation components, and adjusting said polynomial coefficients to minimize said intermodulation components.

48. The system as claimed in claim 47, further comprising a digital multiplexer having a digital input for receiving a digital input signal and being connected to said dual-tone digital oscillator and said polynomial generator for selecting either said digital calibration signals or said digital input signal and passing the selected signals to said polynomial generator for digital compensation by said polynomial generator prior to digital-to-analog conversion by said digital-to-analog converter.

49. The system as claimed in claim 47, further including signal conditioning circuitry connected to said digital-to-analog converter and to said analog output for conditioning said analog signals as said analog signals pass from said digital-to-analog converter to said analog output.

50. The system as claimed in claim 47, wherein said digital signal processing circuits include a digital band-pass filter connected to said analog-to-digital converter for band-pass filtering said digitized signals to select said intermodulation components and produce band-pass filtered signals; and an amplitude detector connected to said band-pass filter for detecting amplitudes of said intermodulation components in said band-pass filtered signals.

51. The system as claimed in claim 50, wherein said amplitude detector is a synchronous detector.

52. The system as claimed in claim 50, wherein said amplitude detector is an asynchronous detector for detecting magnitudes of said intermodulation components, and wherein said digital processing circuits include means for iteratively adjusting a polynomial coefficient and means for determining whether the polynomial coefficient being adjusted is to be increased or decreased depending on whether the polynomial coefficient being adjusted was increased or decreased during a last iteration, and by checking whether a last change to the polynomial coefficient being adjusted caused a magnitude of a detected intermodulation component to increase or decrease.

53. The system as claimed in claim 50, further comprising a modulator connected to said band-pass filter and said analog output for modulating a dc component at said analog output at a frequency passed by said band-pass filter to generate a modulated signal provided to said band-pass filter so that said amplitude detector detects dc offset of said digital-to-analog converter during a dc offset correction mode when said digital-to-analog converter converts a digital value of substantially zero.

54. The system as claimed in claim 53, wherein said modulator is an analog switching modulator connected between said analog output and an analog input of said analog-to-digital converter so that said analog-to-digital converter digitizes said modulated signal.

55. The system as claimed in claim 47, wherein said analog-to-digital converter has a substantially lower dynamic range than said digital-to-analog converter.

56. The system as claimed in claim 47, wherein said analog-to-digital converter has a substantially lower sampling rate than said digital-to-analog converter.

57. An oscillator for providing a low-distortion analog signal having at least one frequency component, said oscillator comprising, in combination:

a digital oscillator for generating a digital signal having said at least one frequency component;

compensation coefficient storage for storing a compensation coefficient;

a digital compensation unit connected to said digital oscillator for receiving said digital signal and connected to said compensation coefficient storage for digitally compensating said digital signal with said compensation coefficient to produce a compensated digital signal, said compensation coefficient specifying a degree of nonlinear distortion of said digital signal produced in Said compensated digital signal; and a digital-to-analog converter connected to said digital compensation unit for converting said compensated digital signal to produce said low-distortion analog signal, wherein said degree of nonlinear distortion of said digital signal produced in said compensated digital signal reduces nonlinear distortion in said low-distortion analog signal.

58. The oscillator as claimed in claim 57, wherein said digital signal has a single frequency component, and said compensation coefficient has a value that minimizes harmonic distortion of said single frequency component in said low-distortion analog signal.

59. An oscillator for providing a low-distortion analog signal having at least one frequency component, said oscillator comprising, in combination:

a digital oscillator for generating a digital signal having said at least one frequency component;

compensation coefficient storage for storing a compensation coefficient;

a digital compensation unit connected to said digital oscillator for receiving said digital signal and connected to said compensation coefficient storage for digitally compensating said digital signal with said compensation coefficient to produce a compensated digital signal; and a digital-to-analog converter connected to said digital compensation unit for converting said compensated digital signal to produce said low-distortion analog signal, wherein said digital signal has only two frequency components and said compensation coefficient has a value that minimizes intermodulation distortion of said two frequency components.

\* \* \* \* \*

UNITED STATES PATENT AND TRADEMARK OFFICE
CERTIFICATE OF CORRECTION

PATENT NO.    :   5,583,501
DATED         :   Dec. 10, 1996
INVENTOR(S)   :   Henrion et al.

It is certified that error appears in the above-identified patent and that said Letters Patent is hereby corrected as shown below:

Column 30, line 50, after "said" delete "to".

Column 30, line 62, change "digital" to -- signal --.

Column 40, line 2, change "Said" to -- said --.

Signed and Sealed this

Twenty-fifth Day of February, 1997

Attest:

BRUCE LEHMAN

*Attesting Officer*    *Commissioner of Patents and Trademarks*